(12) United States Patent
Son et al.

(10) Patent No.: US 11,462,554 B2
(45) Date of Patent: Oct. 4, 2022

(54) THREE-DIMENSIONAL SEMICONDUCTOR MEMORY DEVICE WITH CONCAVE CONVEX SEPARATION STRUCTURES

(71) Applicant: Samsung Electronics Co., Ltd., Suwon-si (KR)

(72) Inventors: Yong-Hoon Son, Yongin-si (KR); Jae Hoon Kim, Seoul (KR); Kwang-ho Park, Cheonan-si (KR); Hyunji Song, Anyang-si (KR); Gyeonghee Lee, Hwaseong-si (KR); Seungjae Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/857,507

(22) Filed: Apr. 24, 2020

(65) Prior Publication Data

US 2021/0082941 A1    Mar. 18, 2021

(30) Foreign Application Priority Data

Sep. 16, 2019 (KR) .................. 10-2019-0113457

(51) Int. Cl.
| | |
|---|---|
| *H01L 27/11565* | (2017.01) |
| *H01L 27/11573* | (2017.01) |
| *H01L 27/1157* | (2017.01) |
| *H01L 23/528* | (2006.01) |
| *H01L 23/522* | (2006.01) |
| *H01L 27/11582* | (2017.01) |

(52) U.S. Cl.
CPC ...... *H01L 27/11573* (2013.01); *H01L 23/528* (2013.01); *H01L 23/5226* (2013.01); *H01L 27/1157* (2013.01); *H01L 27/11565* (2013.01); *H01L 27/11582* (2013.01)

(58) Field of Classification Search
CPC ................... H01L 27/11504–11597
See application file for complete search history.

(56) References Cited

U.S. PATENT DOCUMENTS

| | | | |
|---|---|---|---|
| 9,368,646 B2 | 6/2016 | Kim et al. | |
| 9,406,692 B2 | 8/2016 | Lee | |
| 9,876,031 B1 * | 1/2018 | Shimizu | ............ H01L 29/42344 |

(Continued)

FOREIGN PATENT DOCUMENTS

CN          108807405 A          11/2018

*Primary Examiner* — Allen L Parker
*Assistant Examiner* — Gustavo G Ramallo
(74) *Attorney, Agent, or Firm* — Harness, Dickey & Pierce, P.L.C.

(57) ABSTRACT

A semiconductor memory device is disclosed. The device includes a peripheral circuit structure on a substrate, a semiconductor layer on the peripheral circuit structure, an electrode structure on the semiconductor layer, the electrode structure including electrodes stacked on the semiconductor layer, a vertical channel structure penetrating the electrode structure and being connected to the semiconductor layer, a separation structure penetrating the electrode structure, extending in a first direction, and horizontally dividing the electrode of the electrode structure into a pair of electrodes, an interlayered insulating layer covering the electrode structure, and a through contact penetrating the interlayered insulating layer and being electrically connected to the peripheral circuit structure.

18 Claims, 20 Drawing Sheets

(56) References Cited

U.S. PATENT DOCUMENTS

| | | |
|---|---|---|
| 10,256,115 B2 | 4/2019 | Lee |
| 2011/0065270 A1* | 3/2011 | Shim ................. H01L 27/11582 |
| | | 438/589 |
| 2017/0179026 A1* | 6/2017 | Toyama ............ H01L 27/11573 |
| 2019/0043960 A1 | 2/2019 | Koval et al. |
| 2019/0067322 A1 | 2/2019 | Chen et al. |
| 2019/0096901 A1 | 3/2019 | Dai et al. |
| 2020/0194450 A1* | 6/2020 | Pachamuthu ....... H01L 29/4916 |

* cited by examiner

THREE-DIMENSIONAL SEMICONDUCTOR MEMORY DEVICE WITH CONCAVE CONVEX SEPARATION STRUCTURES

CROSS-REFERENCE TO RELATED APPLICATIONS

This U.S. non-provisional patent application claims priority under 35 U.S.C. § 119 to Korean Patent Application No. 10-2019-0113457, filed on Sep. 16, 2019, in the Korean Intellectual Property Office, the entire contents of which are hereby incorporated by reference.

BACKGROUND

Example embodiments relate to a semiconductor device, and in particular, to a three-dimensional semiconductor memory device with improved reliability.

Higher integration of semiconductor devices is pursued/required to satisfy consumer demands for superior performance and/or inexpensive prices. Since integration of semiconductor devices is an important factor in determining product prices, increased integration is especially pursued/required. Since integration of two-dimensional, e.g. planar, semiconductor devices, integration is mainly determined by the area occupied by a unit memory cell, integration is greatly influenced by a level of a fine pattern forming technology. However, an extremely expensive cost of process equipment needed or used to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

Some example embodiments of inventive concepts provides a three-dimensional semiconductor memory device with improved reliability.

According to some example embodiments of inventive concepts, a semiconductor memory device includes a peripheral circuit structure on a substrate, a semiconductor layer on the peripheral circuit structure, an electrode structure on the semiconductor layer, the electrode structure including electrodes stacked on the semiconductor layer, a vertical channel structure penetrating the electrode structure and connected to the semiconductor layer, a separation structure penetrating the electrode structure, the separation structure extending in a first direction and horizontally dividing at least one of the electrodes of the electrode structure into a pair of electrodes, an interlayered insulating layer covering the electrode structure, and a through contact penetrating the interlayered insulating layer and electrically connected to the peripheral circuit structure. A top surface of the separation structure, a top surface of the vertical channel structure, a top surface of the through contact, and a top surface of the interlayered insulating layer are coplanar with each other.

According to some example embodiments of inventive concepts, a semiconductor memory device may include a peripheral circuit structure on a substrate, a semiconductor layer on the peripheral circuit structure, an electrode structure on the semiconductor layer, the electrode structure including electrodes stacked on the semiconductor layer, a vertical channel structure penetrating the electrode structure and connected to the semiconductor layer, a separation structure penetrating the electrode structure and horizontally dividing at least one of the electrodes of the electrode structure into a pair of electrodes, a cell contact plug penetrating a staircase structure of the electrode structure, an interlayered insulating layer covering the electrode structure, and a through contact penetrating the interlayered insulating layer and being electrically connected to the peripheral circuit structure. The separation structure includes a lower separation structure and an upper separation structure on the lower separation structure, and a width of an upper portion of the lower separation structure is larger than a width of a lower portion of the upper separation structure.

According to some example embodiments of inventive concepts, a semiconductor memory device may include a peripheral circuit structure on a substrate, the peripheral circuit structure including a peripheral transistor on the substrate, a peripheral interconnection line on the peripheral transistor, and a peripheral contact electrically connecting the peripheral transistor to the peripheral interconnection line, a semiconductor layer on the peripheral circuit structure, an electrode structure on the semiconductor layer, the electrode structure including electrodes stacked on the semiconductor layer, a vertical channel structure penetrating the electrode structure and connected to the semiconductor layer, a separation structure penetrating the electrode structure extending in a first direction and horizontally dividing a first electrode of the electrodes into a pair of electrodes, a cell contact plug penetrating a staircase structure of the electrode structure and electrically connected to a second electrode of the electrodes, an interlayered insulating layer covering the electrode structure, a through contact penetrating the interlayered insulating layer and electrically connected to the peripheral interconnection line of the peripheral circuit structure, and a bit line and a connection line on the interlayered insulating layer. The vertical channel structure includes, a vertical semiconductor pattern having a shape like a pipe with an open top end, and a vertical insulating pattern including a data storing layer, the data storing layer interposed between the vertical semiconductor pattern and a third electrode of the electrodes. The bit line is electrically connected to the vertical semiconductor pattern, the connection line is electrically connected to the through contact, and a top surface of the separation structure, a top surface of the vertical channel structure, a top surface of the cell contact plug, and a top surface of the through contact are coplanar with each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not necessarily, however, to scale and may not precisely reflect the precise structural and/or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Figure 1:
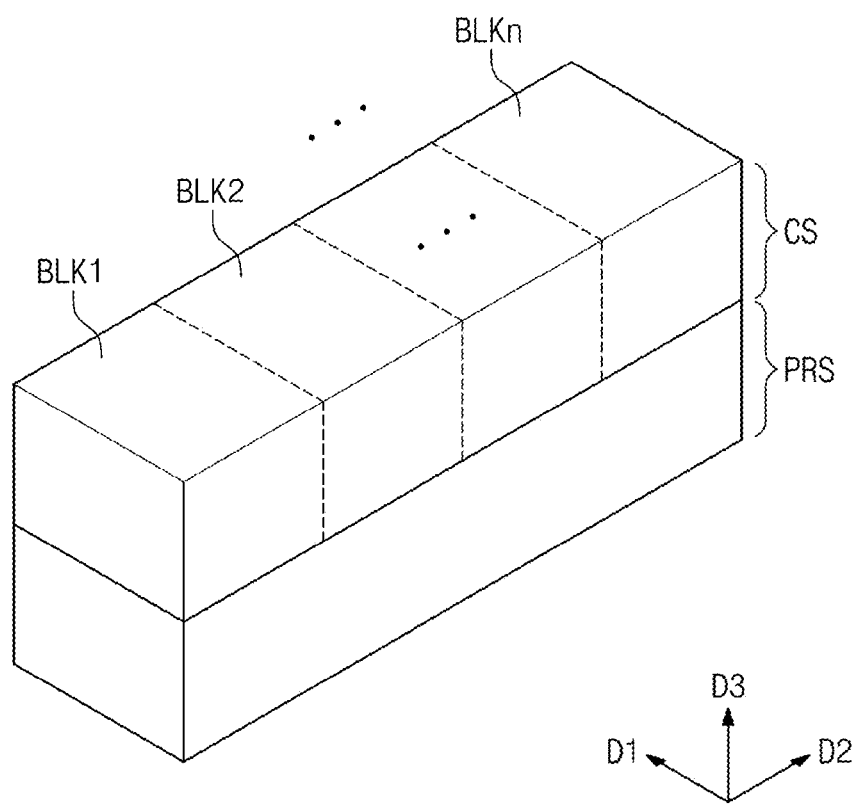
FIG. 1 is a schematic perspective view illustrating a three-dimensional semiconductor memory device according to some example embodiments of inventive concepts.

FIG. 1 is a schematic perspective view illustrating a three-dimensional semiconductor memory device according to some example embodiments of inventive concepts.

Referring to FIG. 1, a three-dimensional semiconductor memory device according to some example embodiments of inventive concepts may include a peripheral circuit structure PS, a cell array structure CS on the peripheral circuit structure PS, and a through contact (not shown) vertically connecting the cell array structure CS to the peripheral circuit structure PS. When viewed in a plan view, the cell array structure CS may be overlapped with the peripheral circuit structure PS.

In some example embodiments of inventive concepts, the peripheral circuit structure PS may include row and/or column decoders, a page buffer, control circuits, and/or peripheral logic circuits. Peripheral logic circuits included in the peripheral circuit structure PS may be integrated on a semiconductor substrate.

The cell array structure CS may include a cell array including a plurality of memory cells, which are three-dimensionally arranged. For example, the cell array structure CS may include a plurality of memory blocks BLK0-BLKn. Each of the memory blocks BLK0-BLKn may include a plurality of memory cells, which are three-dimensionally arranged.

Figure 2:
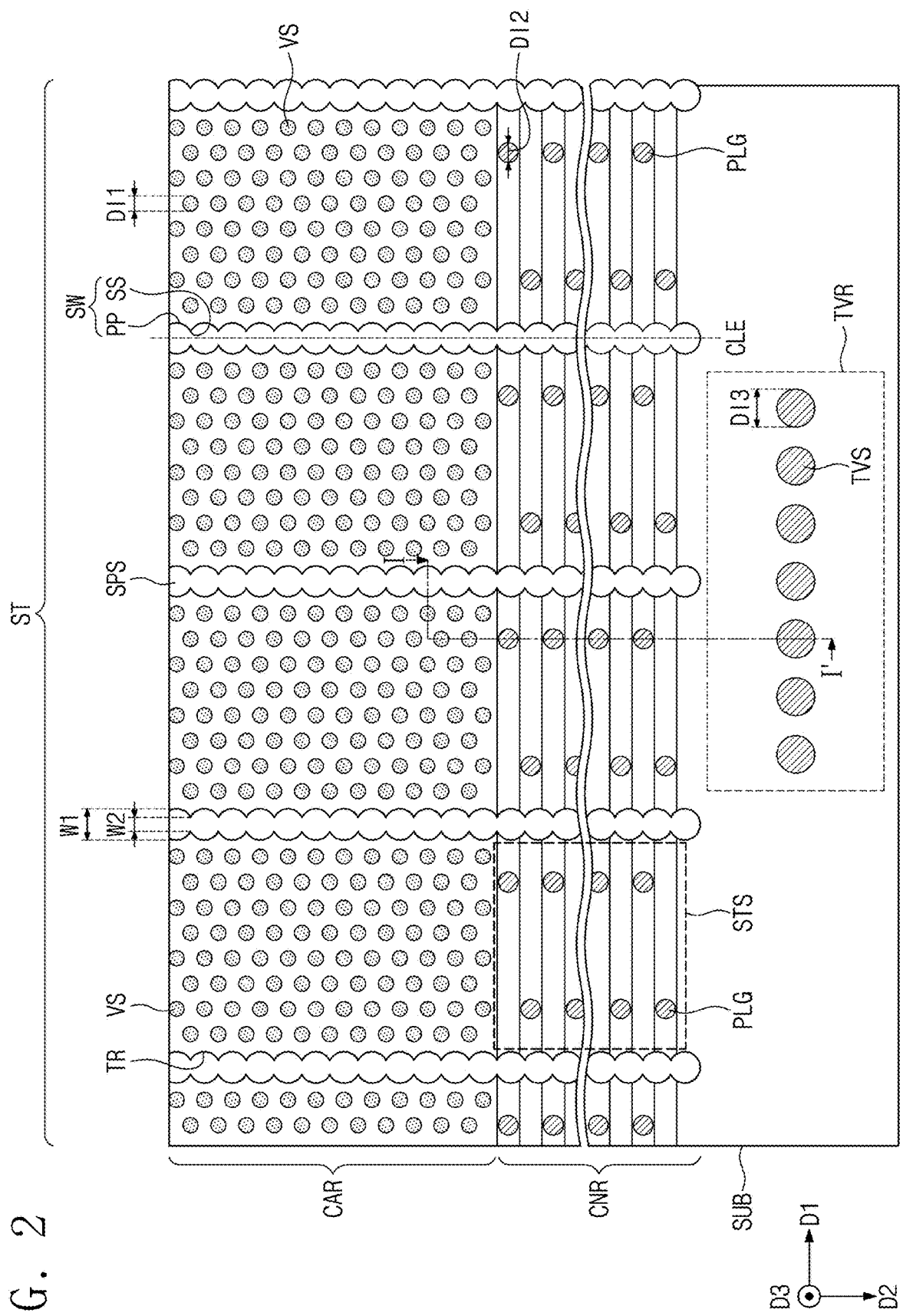
FIG. 2 is a plan view illustrating a three-dimensional semiconductor memory device according to some example embodiments of inventive concepts.
Figure 3:
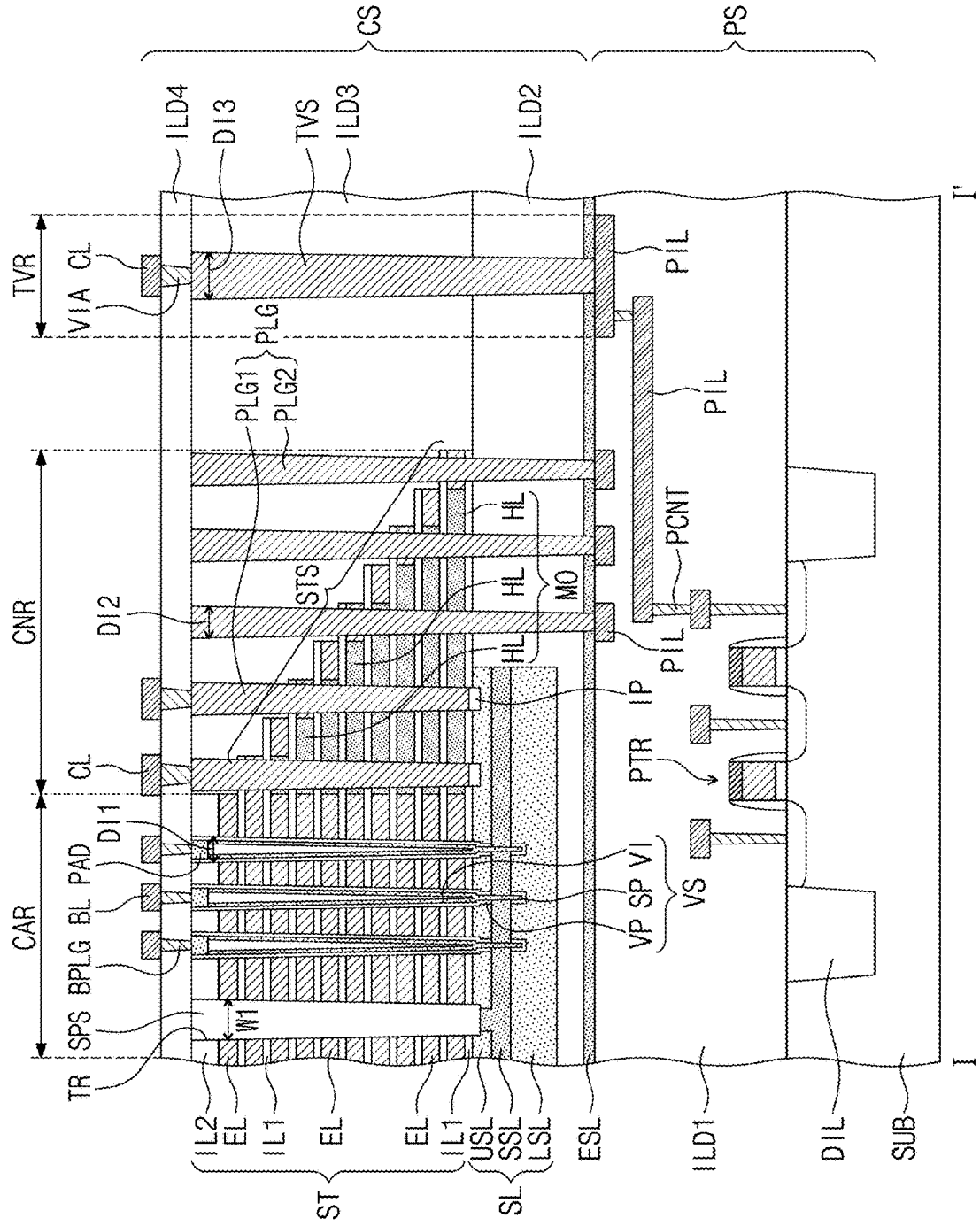
FIG. 3 is a sectional view taken along a line I-I' of FIG. 2.

FIG. 2 is a plan view illustrating a three-dimensional semiconductor memory device according to some example embodiments of inventive concepts. FIG. 3 is a sectional view taken along a line I-I' of FIG. 2.

Referring to FIGS. 2 and 3, the peripheral circuit structure PS including peripheral transistors PTR may be disposed on a substrate SUB. The cell array structure CS including an electrode structure ST may be disposed on the peripheral circuit structure PS. The substrate SUB may be or include a silicon substrate, a silicon-germanium substrate, a germanium substrate, and/or a single-crystalline epitaxial layer grown on a single-crystalline silicon substrate. The substrate SUB may include active regions defined by a device isolation layer DIL.

The peripheral circuit structure PS may include a plurality of the peripheral transistors PTR, which are disposed on the active regions of the substrate SUB. The peripheral transistors PTR may constitute, or be included in, the row and column decoders, the page buffer, the control circuit, and the peripheral logic circuit, as described above. The peripheral transistors PTR may include NMOS and/or PMOS transistors having various oxide thicknesses and/or threshold voltages. The peripheral transistors PTR may include planar transistors; however, example embodiments are not limited thereto. Peripheral interconnection lines PIL may be electrically connected to the peripheral transistors PTR through peripheral contacts PCNT.

A first interlayered insulating layer ILD1 may be provided on the substrate SUB to cover the peripheral transistors PTR, the peripheral contacts PCNT, and the peripheral interconnection lines PIL. The first interlayered insulating layer ILD1 may include a plurality of stacked insulating layers. For example, the first interlayered insulating layer ILD1 may include at least one of silicon oxide layer, a silicon nitride layer, a silicon oxynitride layer, and/or a low-k dielectric layer.

The cell array structure CS may be provided on the peripheral circuit structure PS. Hereinafter, the cell array structure CS will be described in more detail below.

An etch stop layer ESL may be provided on the first interlayered insulating layer ILD1. A second interlayered insulating layer ILD2 may be provided on the etch stop layer ESL. A semiconductor layer SL may be provided in the second interlayered insulating layer ILD2. The semiconductor layer SL may be provided in a cell array region CAR of the cell array structure CS. A portion of the semiconductor layer SL may be provided in a connection region CNR of the cell array structure CS.

The semiconductor layer SL may include a lower semiconductor layer LSL, a source semiconductor layer SSL on the lower semiconductor layer LSL, and an upper semiconductor layer USL on the source semiconductor layer SSL. The lower semiconductor layer LSL, the source semiconductor layer SSL, and the upper semiconductor layer USL may be vertically overlapped with each other. The source semiconductor layer SSL may be interposed between the lower semiconductor layer LSL and the upper semiconductor layer USL. The lower semiconductor layer LSL and the upper semiconductor layer USL may be electrically connected to each other by the source semiconductor layer SSL.

In detail, the lower semiconductor layer LSL may be formed of and/or include at least one of semiconductor materials (e.g., silicon (Si), germanium (Ge), silicon germanium (SiGe), gallium arsenic (GaAs), indium gallium arsenic (InGaAs), or aluminum gallium arsenic (AlGaAs) or mixtures thereof). The lower semiconductor layer LSL may have at least one of single crystalline, amorphous, or polycrystalline structures. As an example, the lower semiconductor layer LSL may include an n-type doped polysilicon layer, e.g. a polysilicon layer including dopants such as arsenic and/or phosphorus.

Although not shown, in some example embodiments, a metal-containing conductive layer may be provided below the lower semiconductor layer LSL. Due to the conductive layer, reducing an electric resistance of the semiconductor layer SL may be possible.

In some example embodiments, each of the source semiconductor layer SSL and the upper semiconductor layer USL may include the same semiconductor material as the lower semiconductor layer LSL. As an example, the source semiconductor layer SSL may include an n-type doped poly-silicon layer. The upper semiconductor layer USL may include an n-type doped poly-silicon layer. A concentration of impurities in the source semiconductor layer SSL may be different from, e.g. may be greater than or less than, that in the lower semiconductor layer LSL. A concentration of impurities in the upper semiconductor layer USL may be different from, e.g. may be greater than or less than, that in the lower semiconductor layer LSL.

The electrode structure ST may be provided on the semiconductor layer SL. The electrode structure ST may include a plurality of electrodes EL, which are stacked on the upper semiconductor layer USL in a vertical direction (e.g., a third direction D3). The electrode structure ST may further include first insulating layers IL1 separating the stacked electrodes EL from each other. The first insulating layers IL1 and the electrodes EL of the electrode structure ST may be alternately stacked in the third direction D3.

The electrode structure ST may be extended from the cell array region CAR of the cell array structure CS to the connection region CNR of the cell array structure CS. The electrode structure ST may have a staircase structure STS on or within the connection region CNR. For example, a height of the electrode structure ST on the connection region CNR may decrease in a stepwise manner with increasing distance from the cell array region CAR.

The electrode structure ST may further include a mold structure MO provided therein. The mold structure MO may be provided in the staircase structure STS and may not be provided within the cell array region CAR. The mold structure MO may include sacrificial layers HL, which are stacked on the second interlayered insulating layer ILD2 in the third direction D3. The mold structure MO may further include the first insulating layers IL1 separating the stacked sacrificial layers HL from each other. The first insulating layers IL1 and the sacrificial layers HL of the mold structure MO may be alternately stacked in the third direction D3.

The sacrificial layers HL of the mold structure MO may be provided to have a staircase structure. For example, a height of the mold structure MO on the connection region CNR may decrease in a stepwise manner with increasing distance from the cell array region CAR.

The sacrificial layer HL of the mold structure MO may physically connect the electrode EL on the cell array region CAR and the electrode EL on the connection region CNR to each other, with the electrode EL on the cell array region CAR and the electrode EL on the connection region located at the same level. For example, the sacrificial layer HL may be interposed between the electrodes EL, which are disposed on the cell array region CAR and the connection region CNR, respectively, and are located at the same level.

The sacrificial layers HL may be formed of and/or include an insulating material, such as silicon nitride and/or silicon oxynitride. Since all of the sacrificial and first insulating layers HL and IL1 of the mold structure MO include insulating materials, the mold structure MO may be an insulator.

The lowermost one of the electrodes EL of the electrode structure ST may serve as a lower selection line. The uppermost one of the electrodes EL of the electrode structure ST may serve as an upper selection line. All of the electrodes EL, other than the lower selection line and the upper selection line, may serve as word lines.

The electrodes EL may include at least one conductive material selected from the group consisting of or including doped semiconductor materials (e.g., doped silicon), metallic materials (e.g., tungsten, copper, or aluminum), conductive metal nitrides (e.g., titanium nitride or tantalum nitride), and transition metals (e.g., titanium or tantalum). The first insulating layers IL1 may be formed of and/or include silicon oxide.

The electrode structure ST on the cell array region CAR may further include a second insulating layer IL2. The second insulating layer IL2 may be locally provided only on the cell array region CAR and may not be provided on the connection region CNR. A thickness of the second insulating layer IL2 may be greater than a thickness of the first insulating layer IL1. The second insulating layer IL2 may be formed of and/or include the same insulating material as the first insulating layer IL1. As an example, the second insulating layer IL2 may be formed of and/or include silicon oxide.

A plurality of vertical channel structures VS penetrating the electrode structure ST may be provided on the cell array region CAR. When viewed in a plan view, the vertical channel structures VS may be arranged in a specific, e.g. periodic, direction and/or in a zigzag and/or honeycomb shape. Each of the vertical channel structures VS may include a vertical insulating pattern VP, a vertical semiconductor pattern SP, and a gap-fill insulating pattern VI.

The vertical insulating pattern VP may be interposed between the electrode structure ST and the vertical semiconductor pattern SP. The vertical insulating pattern VP may be vertically extended from a top surface of the electrode structure ST toward the lower semiconductor layer LSL. The vertical insulating pattern VP may be shaped like a pipe, e.g. like a PVC pipe, with an open top end. The vertical semiconductor pattern SP may cover an inner side surface of the vertical insulating pattern VP. The vertical semiconductor pattern SP, along with the vertical insulating pattern VP, may be extended toward the lower semiconductor layer LSL. The vertical semiconductor pattern SP may also be shaped like a pipe, e.g. like a PVC pipe, with an open top end. An internal space of the vertical semiconductor pattern SP may be filled with the gap-fill insulating pattern VI.

The vertical insulating pattern VP may include one or more layers. In some example embodiments of inventive concepts, the vertical insulating pattern VP may include a data storing layer. For example, the vertical insulating pattern VP may serve as a data storing layer of a NAND FLASH memory device and/or as a part of the data storing layer and may include a tunnel insulating layer, a charge storing layer, and a blocking insulating layer. In the NAND FLASH memory device, the charge storing layer between the electrode EL and the vertical semiconductor pattern SP may be used to store data. The data stored in the charge storing layer may be changed by the Fowler-Nordheim (FN) tunneling phenomenon, which may occur when there is a voltage difference, e.g. at least a specific voltage difference, between the electrode EL and the vertical semiconductor pattern SP.

For example, the charge storing layer may be and/or include a trap insulating layer, a floating gate electrode, or an insulating layer with conductive nano dots. In some example embodiments, the charge storing layer may include at least one of a silicon nitride layer, a silicon oxynitride layer, a silicon-rich nitride layer, a nanocrystalline silicon layer, or a laminated trap layer. The tunnel insulating layer may be formed of and/or include at least one of materials whose band gaps are greater than that of the charge storing layer.

The tunnel insulating layer may be formed of and/or include at least one of high-k dielectric materials (e.g., aluminum oxide and/or hafnium oxide) or silicon oxide. The blocking insulating layer may be formed of and/or include silicon oxide.

The vertical semiconductor pattern SP may be formed of and/or include at least one of semiconductor materials (e.g., silicon (Si), germanium (Ge), or mixtures thereof). Furthermore, the vertical channel structures VS may be formed of and/or include a doped semiconductor material or an intrinsic semiconductor material. The vertical semiconductor pattern SP containing the semiconductor material may be used as channel regions of transistors constituting, or corresponding to, cell strings of the NAND FLASH memory device.

A conductive pad PAD may be provided in or on an upper portion of each of the vertical channel structures VS. The conductive pad PAD may cover a top surface of the vertical semiconductor pattern SP and a top surface of the gap-fill insulating pattern VI. A side surface of the conductive pad PAD may be in contact with an inner surface of the vertical insulating pattern VP. The conductive pad PAD may be formed of and/or include at least one of doped semiconductor materials or conductive materials. A bit line contact plug BPLG may be electrically connected to the vertical semiconductor pattern SP through the conductive pad PAD.

Each of the vertical channel structures VS may have a first diameter DI1. The first diameter DI1 of the vertical channel structure VS may be gradually decreased in a downward direction. The first diameter DI1 may have the largest value at the top level of the vertical channel structure VS. The channel structure VS may have a tapered shape in cross-section.

The source semiconductor layer SSL may be in contact with, e.g. in direct contact with a lower sidewall of each of the vertical semiconductor patterns SP. The source semiconductor layer SSL may electrically connect the vertical semiconductor patterns SP to each other. Accordingly, the vertical semiconductor patterns SP, the source semiconductor layer SSL, the lower semiconductor layer LSL, and the upper semiconductor layer USL may be electrically connected to each other.

The three-dimensional semiconductor memory device according to some example embodiments of inventive concepts may be or include a three-dimensional NAND FLASH memory device. Cell strings of the NAND FLASH memory device may be integrated in the electrode structure ST on the semiconductor layer SL. The electrode structure ST and the vertical channel structures VS penetrating the same may constitute or correspond to memory cells, which are three-dimensionally arranged on the semiconductor layer SL. The electrodes EL of the electrode structure ST may be used as gate electrodes of transistors.

A plurality of separation structures SPS may be provided to penetrate the electrode structure ST. The separation structures SPS may extend in a second direction D2 and parallel to each other. For example, the separation structures SPS may horizontally divide one electrode EL of the electrode structure ST into a plurality of electrodes EL. The plurality of electrodes EL divided by the separation structures SPS may be arranged in a first direction D1. The first direction D1 may be horizontal to a surface of the substrate SUB. The plurality of electrodes EL divided by the separation structures SPS may be extended in the second direction D2 and may be parallel to each other. The second direction D1 may be horizontal to a surface of the substrate SUB. The separation structures SPS may be formed of and/or include an insulating material (e.g., silicon oxide).

Referring back to FIG. 2, a sidewall SW of the separation structure SPS may have a wavy and/or concave-convex shape, when viewed in a plan view. In detail, the sidewall SW of the separation structure SPS may include a protruding portion PP and a recessed portion SS. The protruding portion PP may protrude in a direction away from a center line CLE of the separation structure SPS. For example, the protruding portion PP may protrude from the center line CLE of the separation structure SPS that protrudes in the second direction D2. The recessed portion SS may be recessed from the protruding portion PP that protrudes toward the center line CLE of the separation structure SPS.

The largest width W1 of the separation structure SPS in the first direction D1 may be defined by an opposite pair of the protruding portions PP of the sidewalls SW that are opposite to each other. The smallest width W2 of the separation structure SPS in the first direction D1 may be defined by an opposite pair of the recessed portions SS of the sidewalls SW that are opposite to each other. The largest width W1 of the separation structure SPS may be larger than the first diameter DI1 of an upper portion of the vertical channel structure VS. The smallest width W2 of the separation structure SPS may be smaller than, the same as, or larger than, the first diameter DI1 of the upper portion of the vertical channel structure VS.

Referring back to FIGS. 2 and 3, a third interlayered insulating layer ILD3 may be provided on the semiconductor layer SL and the second interlayered insulating layer ILD2. The third interlayered insulating layer ILD3 may cover the staircase structure STS of the electrode structure ST. A fourth interlayered insulating layer ILD4 may be provided on the third interlayered insulating layer ILD3.

Cell contact plugs PLG may be provided on the connection region CNR. The cell contact plug PLG may be provided to penetrate the electrode EL of the staircase structure STS and the mold structure MO below the electrode EL. Since, as described above, the mold structure MO is or includes the insulator, one cell contact plug PLG may be connected to one electrode EL.

Each of the cell contact plugs PLG may have a second diameter DI2. The second diameter DI2 of the cell contact plug PLG may be gradually decreased in a downward direction. The second diameter DI2 may have the largest value at the top level of the cell contact plug PLG. The second diameter DI2 of an upper portion of the cell contact plug PLG may be larger than the first diameter DI1 of the upper portion of the vertical channel structure VS. The contact plug PLG may have a tapered shape.

The cell contact plugs PLG may include a first cell contact plug PLG1 and a second cell contact plug PLG2. The first cell contact plug PLG1 may be provided to penetrate the staircase structure STS of the electrode structure ST and may be extended toward the semiconductor layer SL. An insulating pattern IP may be interposed between the first cell contact plug PLG1 and the upper semiconductor layer USL. The first cell contact plug PLG1 may be disconnected, e.g. electrically disconnected, from the semiconductor layer SL by the insulating pattern IP.

The second cell contact plug PLG2 may penetrate the staircase structure STS of the electrode structure ST and may be extended toward the peripheral circuit structure PS. The second cell contact plug PLG2 may further penetrate the second interlayered insulating layer ILD2 and the etch stop layer ESL and may be coupled to the topmost one of the peripheral interconnection lines PIL. As a result, the electrode EL and the topmost one of the peripheral interconnection lines PIL may be electrically connected to each other through the second cell contact plug PLG2.

At least one through contact TVS may be provided on a through contact region TVR of the substrate SUB. The through contact TVS may be provided to penetrate the third interlayered insulating layer ILD3, the second interlayered insulating layer ILD2, and the etch stop layer ESL and may be coupled to the topmost one of the peripheral interconnection lines PIL. When viewed in a plan view, the through contact TVS may be provided in the through contact region TVR. The through contact region TVR may be adjacent to the staircase structure STS of the electrode structure ST in the second direction D2.

The through contact TVS may have a third diameter DI3. The third diameter DI3 of the through contact TVS may gradually decrease in a downward direction. The third diameter DI3 may have the largest value at the top level of the through contact TVS. The third diameter DI3 of an upper portion of the through contact TVS may be greater than the first diameter DI1 of the upper portion of the vertical channel structure VS. The through contact TVS may have a tapered shape.

A plurality of bit lines BL and a plurality of connection lines CL may be provided on the fourth interlayered insulating layer ILD4. The bit lines BL may be extended in the first direction D1 and parallel to each other.

The bit line contact plugs BPLG may be provided in, e.g. within, the fourth interlayered insulating layer ILD4. The bit line contact plugs BPLG may be respectively coupled to the conductive pads PAD on the vertical channel structures VS. Each of the bit lines BL may be electrically connected to the vertical semiconductor pattern SP through the bit line contact plug BPLG.

Vias VIA may be provided in the fourth interlayered insulating layer ILD4. At least one of the connection lines CL may be electrically connected to the first cell contact plug PLG1 through the via VIA. At least one of the connection lines CL may be electrically connected to the through contact TVS through the via VIA.

According to some example embodiments of inventive concepts, each of, or at least some of, the vertical channel structures VS, the separation structures SPS, the cell contact plugs PLG, and the through contact TVS may have top surfaces that are coplanar with each other. For example, the top surfaces of each of, or at least some of, the vertical channel structures VS, the separation structures SPS, the cell contact plugs PLG, and the through contact TVS may be coplanar with a top surface of the third interlayered insulating layer ILD3.

FIGS. 4 to 13 are sectional views, which are taken along the line I-I' of FIG. 2 to illustrate a method of fabricating a three-dimensional semiconductor memory device according to some example embodiments of inventive concepts. FIGS. 14A, 14B, and 14C are plan views illustrating a method of forming a trench of FIG. 8.

Figure 4:
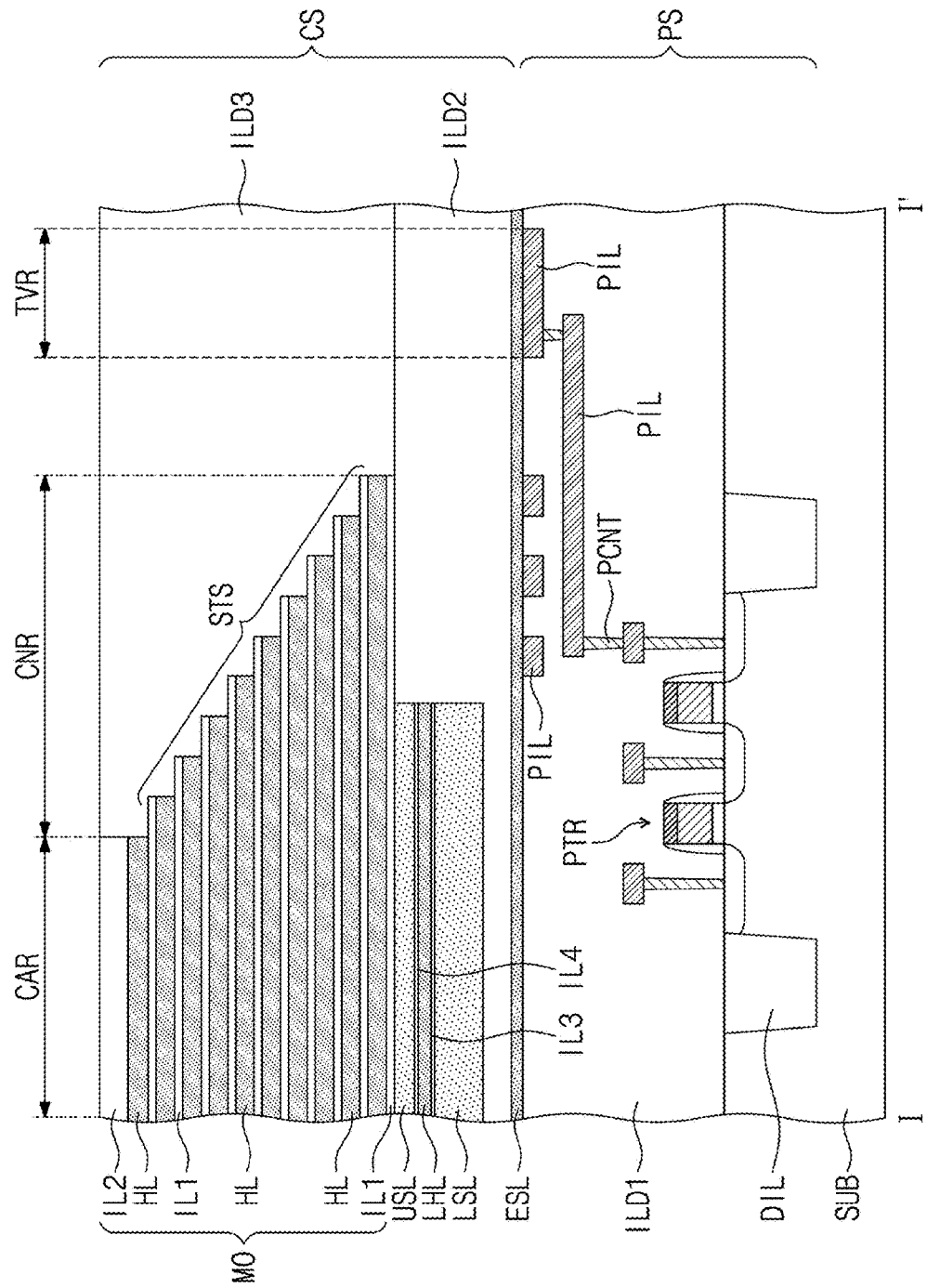
FIGS. 4 to 13 are sectional views, which are taken along the line I-I' of FIG. 2 to illustrate a method of fabricating a three-dimensional semiconductor memory device according to some example embodiments of inventive concepts.

Referring to FIGS. 2 and 4, the peripheral circuit structure PS may be formed on the substrate SUB. The formation of the peripheral circuit structure PS may include forming the peripheral transistors PTR on the substrate SUB, forming the peripheral interconnection lines PIL on the peripheral transistors PTR, forming the peripheral contacts PCNT connecting the peripheral transistors PTR to the peripheral interconnection lines PIL, and forming the first interlayered insulating layer ILD1.

For example, the formation of the peripheral transistors PTR may include forming the device isolation layer DIL on the substrate SUB to define the active regions, doping portions of the active regions to form well regions, forming a gate insulating layer and a gate electrode on the active regions, and/or doping upper portions of the active regions with impurities to form source/drain regions.

The etch stop layer ESL may be formed on the first interlayered insulating layer ILD1. The second interlayered insulating layer ILD2 may be formed on the etch stop layer ESL. The lower semiconductor layer LSL may be formed in the second interlayered insulating layer ILD2. The lower semiconductor layer LSL may be formed of and/or include at least one of semiconductor materials (e.g., silicon (Si), germanium (Ge), silicon germanium (SiGe), gallium arsenic (GaAs), indium gallium arsenic (InGaAs), aluminum gallium arsenic (AlGaAs) or mixtures thereof.

A third insulating layer IL3, a lower sacrificial layer LHL, and a fourth insulating layer IL4 may be formed on the lower semiconductor layer LSL. When viewed in a plan view, the lower sacrificial layer LHL may be overlapped with the lower semiconductor layer LSL. For example, the third and fourth insulating layers IL3 and IL4 may be formed of and/or include silicon oxide, and the lower sacrificial layer LHL may be formed of and/or include silicon nitride or silicon oxynitride.

The upper semiconductor layer USL may be formed on the lower sacrificial layer LHL. When viewed in a plan view, the upper semiconductor layer USL may overlap with the lower semiconductor layer LSL. A top surface of the upper semiconductor layer USL may be coplanar with a top surface of the second interlayered insulating layer ILD2. The upper semiconductor layer USL may be formed of and/or include a semiconductor material.

The mold structure MO may be formed on the upper semiconductor layer USL. For example, the mold structure MO may be formed by repeatedly and alternately stacking the first insulating layers IL1 and the sacrificial layers HL on the upper semiconductor layer USL. The second insulating layer IL2 may be formed as the topmost layer of the mold structure MO.

The first insulating layers IL1, the sacrificial layers HL, and the second insulating layer IL2 may be deposited using at least one of thermal or low-pressure chemical vapor deposition (CVD), plasma-enhanced chemical vapor deposition (PECVD), physical chemical vapor deposition, or atomic layer deposition (ALD) processes. The first insulating layers IL1 may be formed of and/or include silicon oxide, and the sacrificial layers HL may be formed of and/or include silicon nitride or silicon oxynitride.

The staircase structure STS may be formed in the mold structure MO. For example, the cell array structure CS on the peripheral circuit structure PS may include the cell array region CAR and the connection region CNR. A cyclic patterning process may be performed on the mold structure MO to form the staircase structure STS on the connection region CNR.

The formation of the staircase structure STS may include forming a mask pattern (not shown) on the mold structure MO and performing a cyclic patterning process using the mask pattern several times. Each cyclic patterning process may include etching a portion of the mold structure MO using the mask pattern as an etch mask and performing a trimming process of reducing a size of the mask pattern.

The third interlayered insulating layer ILD3 may be formed on the mold structure MO. The formation of the third interlayered insulating layer ILD3 may include thickly forming an insulating layer to cover the mold structure MO and performing a planarization process, such as a chemical mechanical planarization (CMP) and/or an etch back process, on the insulating layer to expose the second insulating layer IL2.

Figure 5:
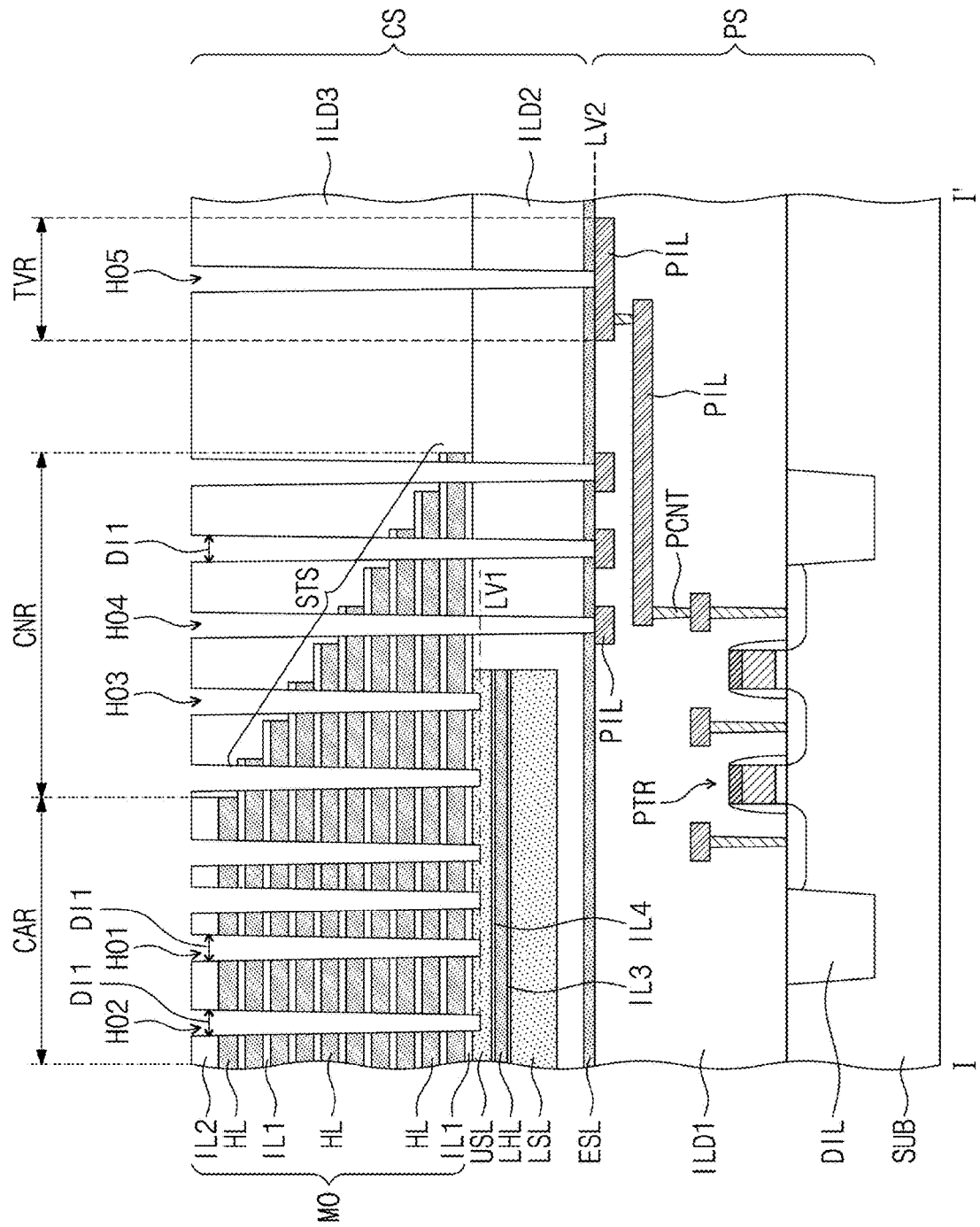

Referring to FIGS. 2 and 5, a patterning process may be performed on the structure with the third interlayered insulating layer ILD3 to form first to fifth holes HO1-HO5 with high aspect ratios. The patterning process may include forming a hard mask with a plurality of openings on the mold structure MO and the third interlayered insulating layer ILD3 and performing an anisotropic etching process using the hard mask as an etch mask. The anisotropic etching process may be or include a plasma etching process, a reactive ion etching (RIE) process, an inductively-coupled plasma reactive ion etching (ICP-RIE) process, and/or an ion beam etching (IBE) process.

The first to fifth holes HO1-HO5 may be formed to have the same or similar diameter. Each of the first to fifth holes HO1-HO5 may have the first diameter DI1 at its top level.

The first to third holes HO1, HO2, and HO3 may be formed on the upper semiconductor layer USL. The first to third holes HO1, HO2, and HO3 may penetrate the mold structure MO and may expose the upper semiconductor layer USL. The first to third holes HO1, HO2, and HO3 may have bottoms which are located at the same level (e.g., a first level LV1).

The fourth and fifth holes HO4 and HO5 may be formed on the second interlayered insulating layer ILD2. The fifth hole HO5 may be formed in the through contact region TVR. The fourth and fifth holes HO4 and HO5 may penetrate the mold structure MO, the second interlayered insulating layer ILD2, and the etch stop layer ESL, and may expose the topmost one of the peripheral interconnection lines PIL. The fourth and fifth holes HO4 and HO5 may have bottoms, which are located at the same level (e.g., a second level LV2). The second level LV2 may be lower than the first level LV1.

By adjusting an etch recipe in the anisotropic etching process of forming the first to fifth holes HO1-HO5, terminating the etching of the first to third holes HO1, HO2, and HO3 when the upper semiconductor layer USL is exposed may be possible. The etching of the fourth and fifth holes HO4 and HO5 may be adjusted to be terminated when the topmost one of the peripheral interconnection lines PIL is exposed. In other words, by once performing the anisotropic etching process, forming the holes HO1-HO5, whose bottoms are located at different levels, may be possible. The anisotropic etching process may be performed using, e.g. based on, the etch selectivity (i.e., difference in etch rate) between the upper semiconductor layer USL and the second interlayered insulating layer ILD2. For example, an endpoint of the anisotropic etching process may be determined based on an optical emission signal associated with the upper semiconductor layer USL.

Figure 6:
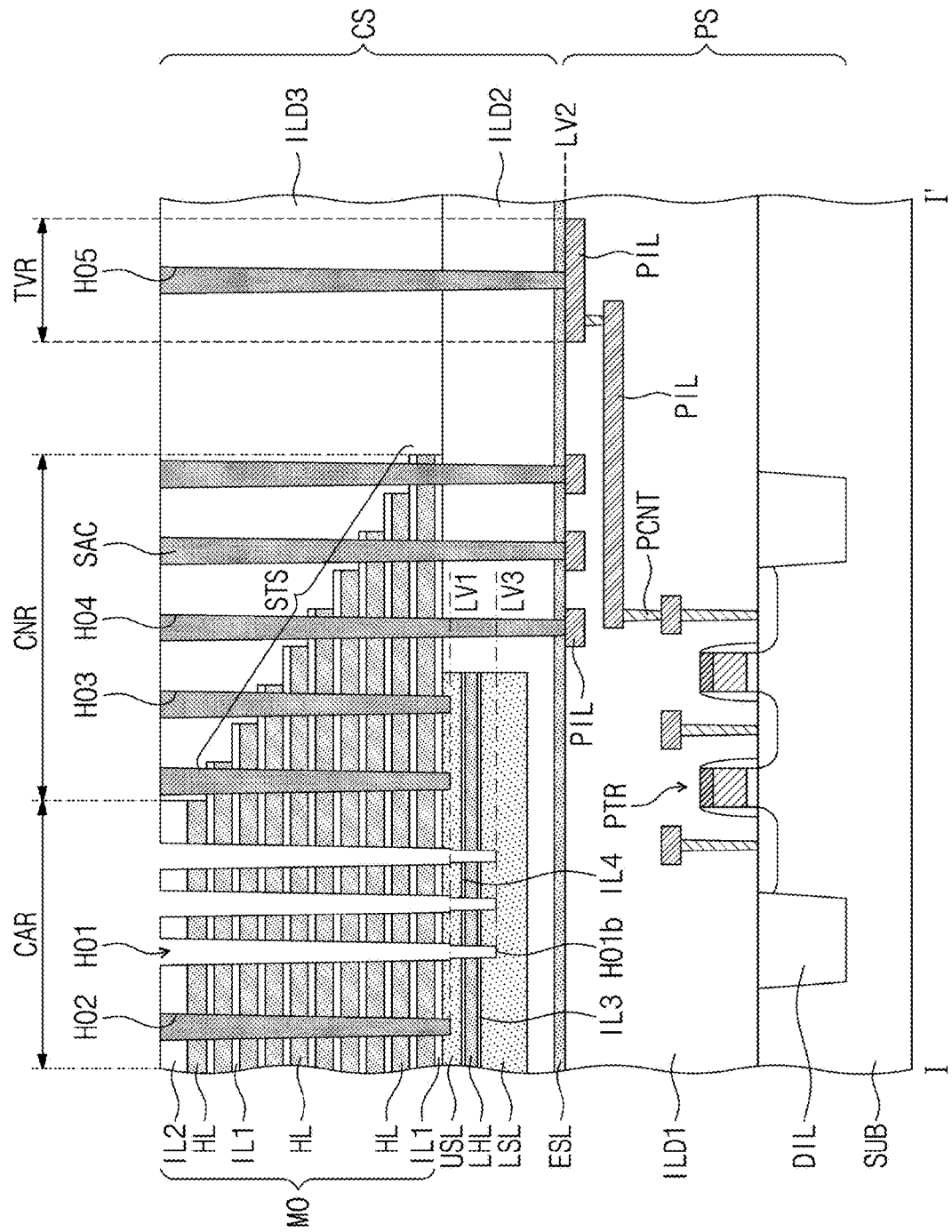

Referring to FIGS. 2 and 6, a sacrificial material SAC may be formed to fill the first to fifth holes HO1-HO5. Thereafter, the first holes HO1 may be evacuated by selectively removing the sacrificial material SAC from the first holes HO1. An anisotropic etching process may additionally be performed on the first holes HO1, from which the sacrificial material SAC is removed, such that the first holes HO1 have bottoms HO1B located at a third level LV3. The third level LV3 may be lower than the first level LV1. The third level LV3 may be located between bottom and top levels of the lower semiconductor layer LSL. For example, the first holes HO1 may be formed to expose the lower semiconductor layer LSL, due to the additional anisotropic etching process.

Figure 7:
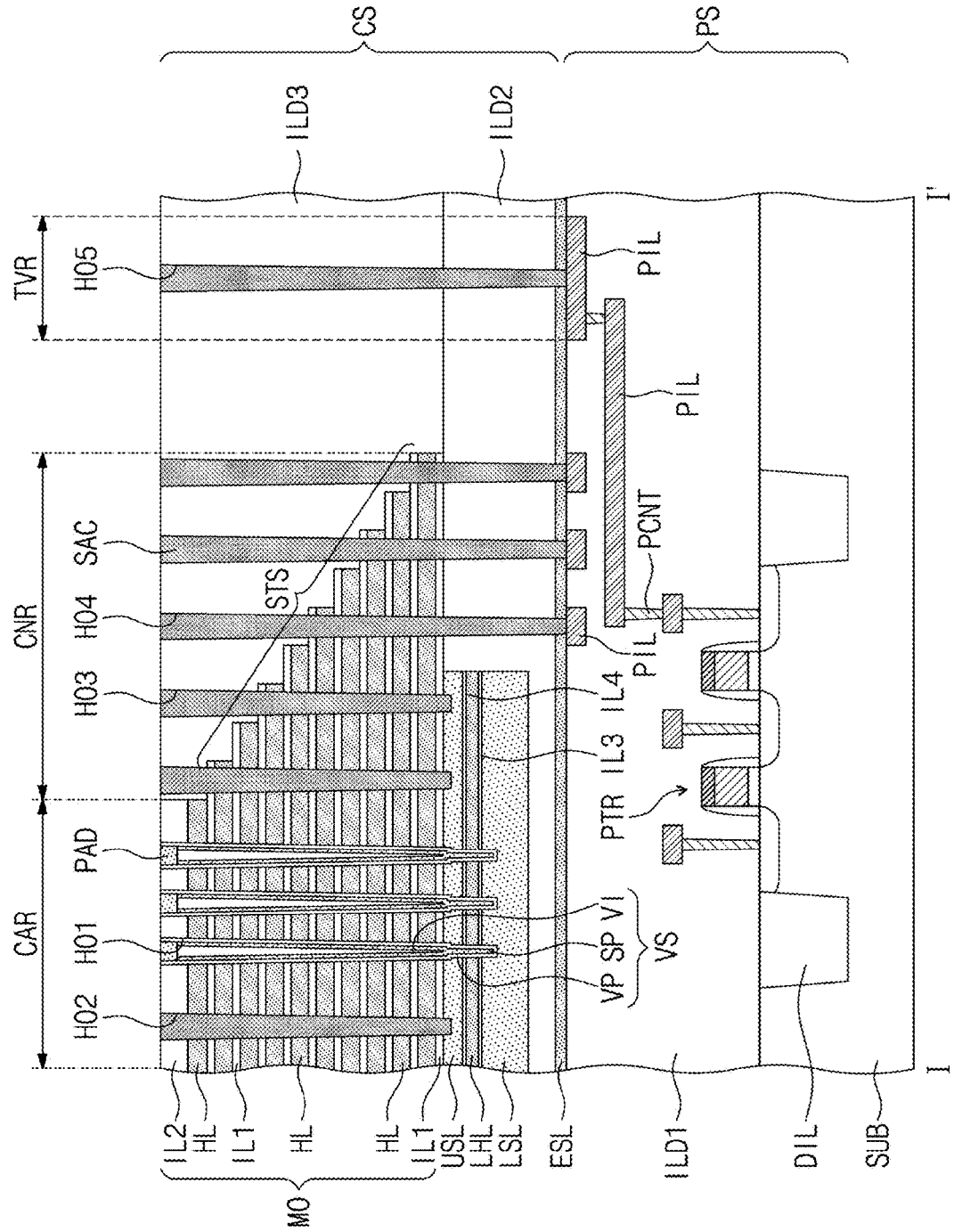

Referring to FIGS. 2 and 7, the vertical channel structures VS may be formed in the first holes HO1, respectively. In detail, the formation of the vertical channel structure VS may include sequentially forming a vertical insulating layer, a vertical semiconductor layer, and an insulating gapfill layer on an inner surface of the first hole HO1, and then performing a planarization process to expose a top surface of the second insulating layer IL2. The planarization process may include at least one of a CMP process or an etch-back process. The vertical insulating layer and the vertical semiconductor layer may be formed to conformally cover the inner surface of the first hole HO1.

As a result of the planarization process, the vertical insulating pattern VP may be formed to cover the inner surface of the first hole HO1. The vertical insulating pattern VP may be shaped like a pipe, e.g. a PVC pipe, with an open top end. The vertical insulating pattern VP may include a data storing layer.

Similarly, the vertical semiconductor pattern SP may be formed to cover an inner surface of the vertical insulating pattern VP. The vertical semiconductor pattern SP may be shaped like a pipe, e.g. a PVC pipe, with an open top end. Due to the vertical insulating pattern VP, the vertical semiconductor pattern SP may be spaced apart from the upper semiconductor layer USL and the lower semiconductor layer LSL.

The gap-fill insulating pattern VI may be formed to fill an inner space of the vertical semiconductor pattern SP. The vertical insulating pattern VP, the vertical semiconductor pattern SP, and the gap-fill insulating pattern VI may constitute or be included in the vertical channel structure VS. The conductive pad PAD may be formed in or on an upper portion of each of the vertical channel structures VS.

Figure 8:
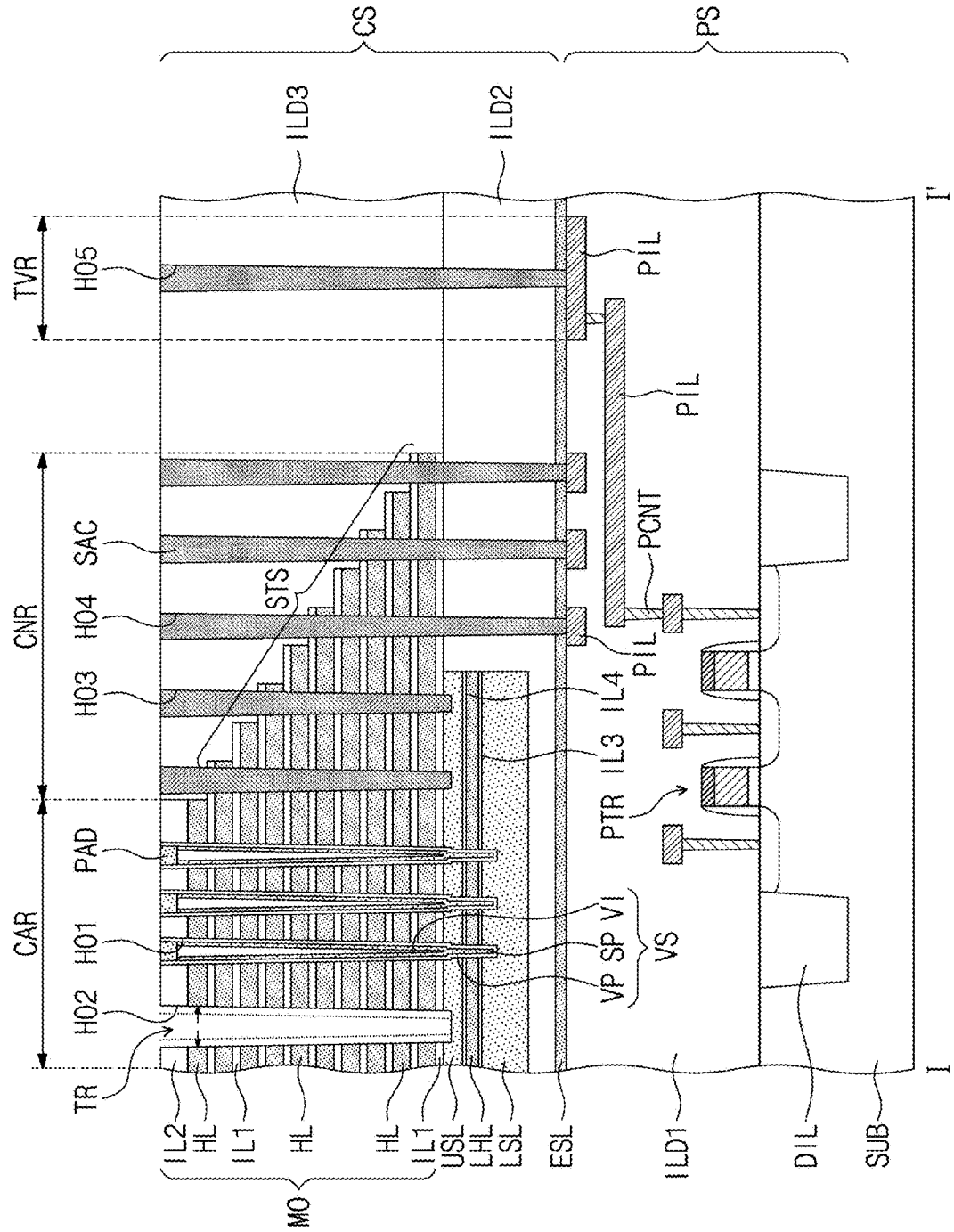

Referring to FIGS. 2, 8, and 14A, the second holes HO2 may be evacuated by selectively removing the sacrificial material SAC from the second holes HO2. The second holes HO2 may be arranged in the second direction D2.

Referring to FIGS. 2, 8, and 14B, an isotropic etching process may be performed on the second holes HO2 to expand the second holes HO2. The second holes HO2 may correspond to holes from which the sacrificial material SAC is removed. As a result of the isotropic etching process, the second holes HO2 arranged in the second direction D2 may be connected to each other to form a trench TR elongated in the second direction D2.

The trenches TR may be formed to penetrate the mold structure MO. The trenches TR may be extended in the second direction D2 and may be parallel to each other. Due to the trenches TR, each sacrificial layer HL of the mold structure MO may be horizontally divided into a plurality of sacrificial layers HL. When viewed in a plan view, the sidewall SW of the trench TR may have a wavy or concave-convex shape. The sidewall SW of the trench TR may include the protruding portion PP and the recessed portion SS.

In some example embodiments, in a case where the isotropic etching process on the second holes HO2 is performed in an enhanced manner compared with that shown in FIG. 14B, the trench TR may be formed to have a line shape in a plan view, as shown in FIG. 14C. For example, the sidewall SW of the trench TR may have a linear shape. Thus, the separation structure SPS, which will be formed in the trench TR, may also have a line shape, when viewed in a plan view.

Figure 9:
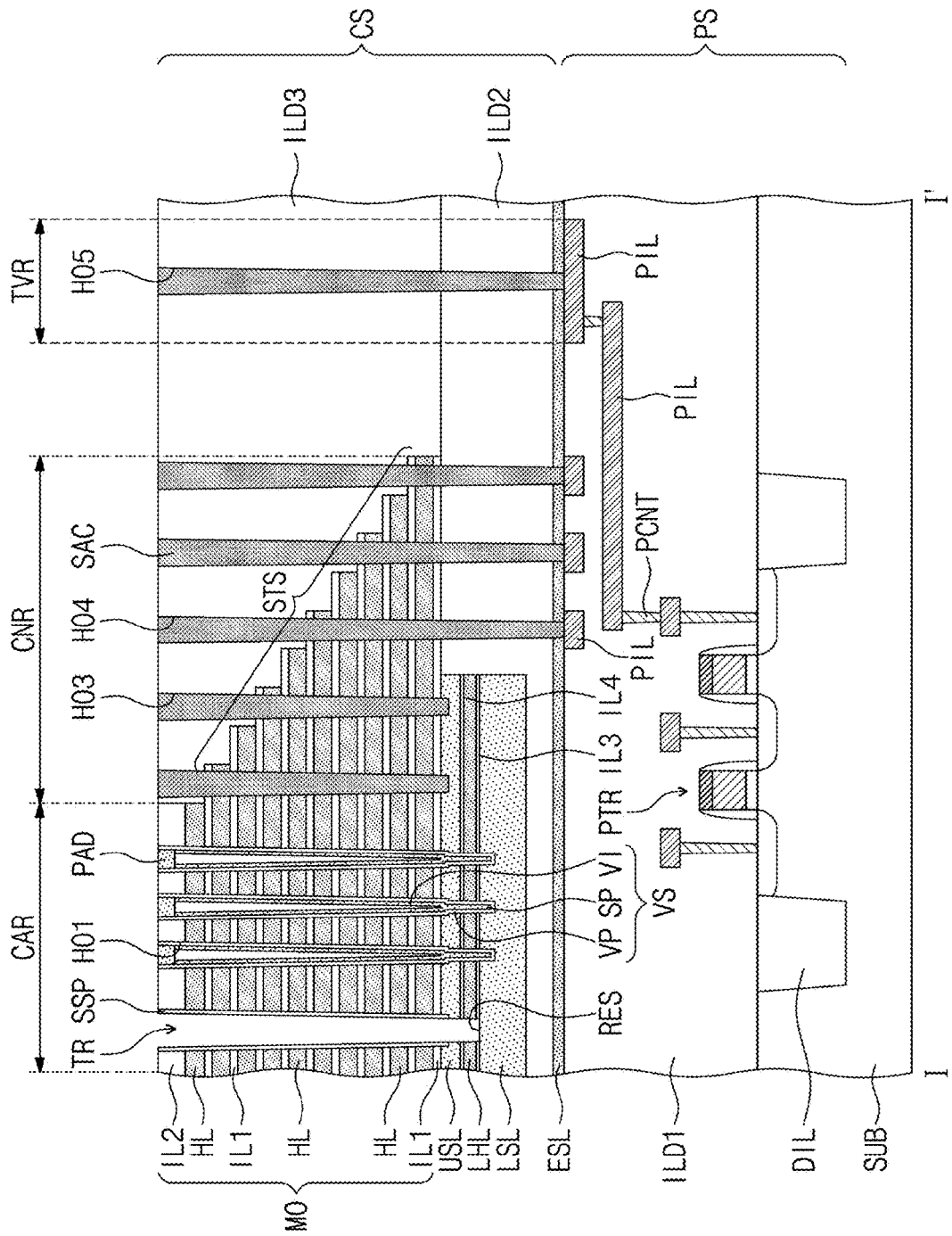

Referring to FIGS. 2 and 9, a sidewall spacer SSP may be formed on an inner sidewall of the trench TR. The formation of the sidewall spacer SSP may include forming an insulating layer on the inner sidewall of the trench TR and anisotropically etching the insulating layer to expose a bottom of the trench TR.

An anisotropic etching process may be performed on the trench TR to form a recess RES which extends from the trench TR to the lower semiconductor layer LSL. For example, the trench TR may be formed to expose the lower semiconductor layer LSL. The trench TR may expose an inner sidewall of the third insulating layer IL3, an inner sidewall of the lower sacrificial layer LHL, and an inner sidewall of the fourth insulating layer IL4.

Figure 10:
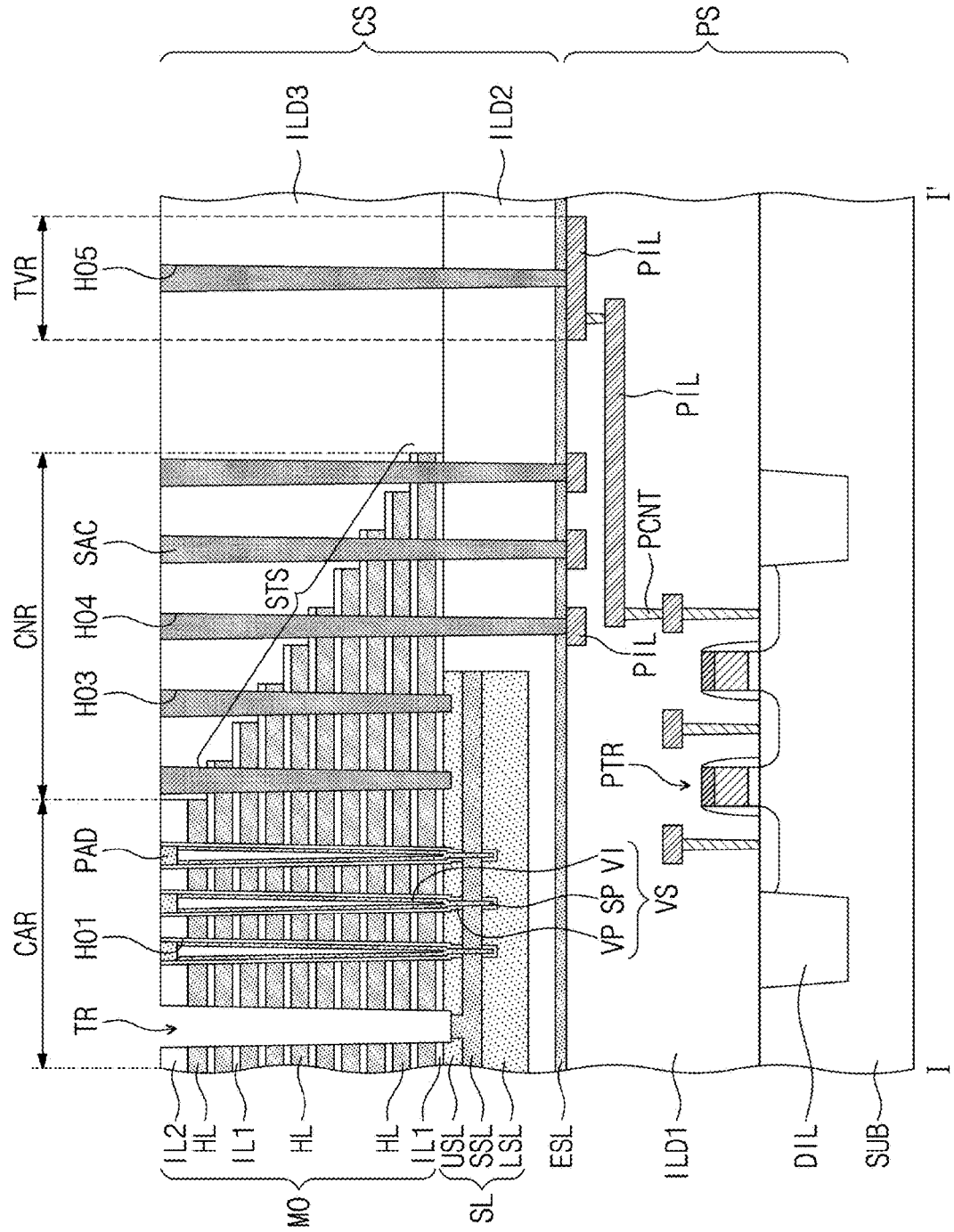

Referring to FIGS. 2 and 10, the lower sacrificial layer LHL exposed through the trench TR may be replaced with the source semiconductor layer SSL. In detail, the lower sacrificial layer LHL exposed through the trenches TR may be selectively removed. The lower sacrificial layer LHL may be removed with a wet etching process; however, example embodiments are not limited thereto. A lower portion of the vertical insulating pattern VP of each of the vertical channel structures VS may be exposed as a result of the removal of the lower sacrificial layer LHL.

The exposed lower portion of the vertical insulating pattern VP may be selectively removed, e.g. removed with a wet etching process. Accordingly, a lower portion of the vertical semiconductor pattern SP may be exposed. The third insulating layer IL3 and the fourth insulating layer IL4 may be removed concurrently during the removal of the lower portion of the vertical insulating pattern VP.

The source semiconductor layer SSL may be formed in the space which is formed by removing the third insulating layer IL3, the lower sacrificial layer LHL, and the fourth insulating layer IL4. The source semiconductor layer SSL may be in contact with, e.g. in direct contact with the exposed lower portion of the vertical semiconductor pattern SP. The source semiconductor layer SSL may also be in direct contact with the lower semiconductor layer LSL thereunder. The source semiconductor layer SSL may also be in contact with, e.g. in direct contact with the upper semiconductor layer USL thereon. The upper semiconductor layer USL, the source semiconductor layer SSL, and the lower semiconductor layer LSL may constitute or be included in the semiconductor layer SL.

Thereafter, the sidewall spacer SSP may be selectively removed from the trench TR. Accordingly, inner sidewalls of the sacrificial layers HL may be exposed through the trench TR.

Figure 11:
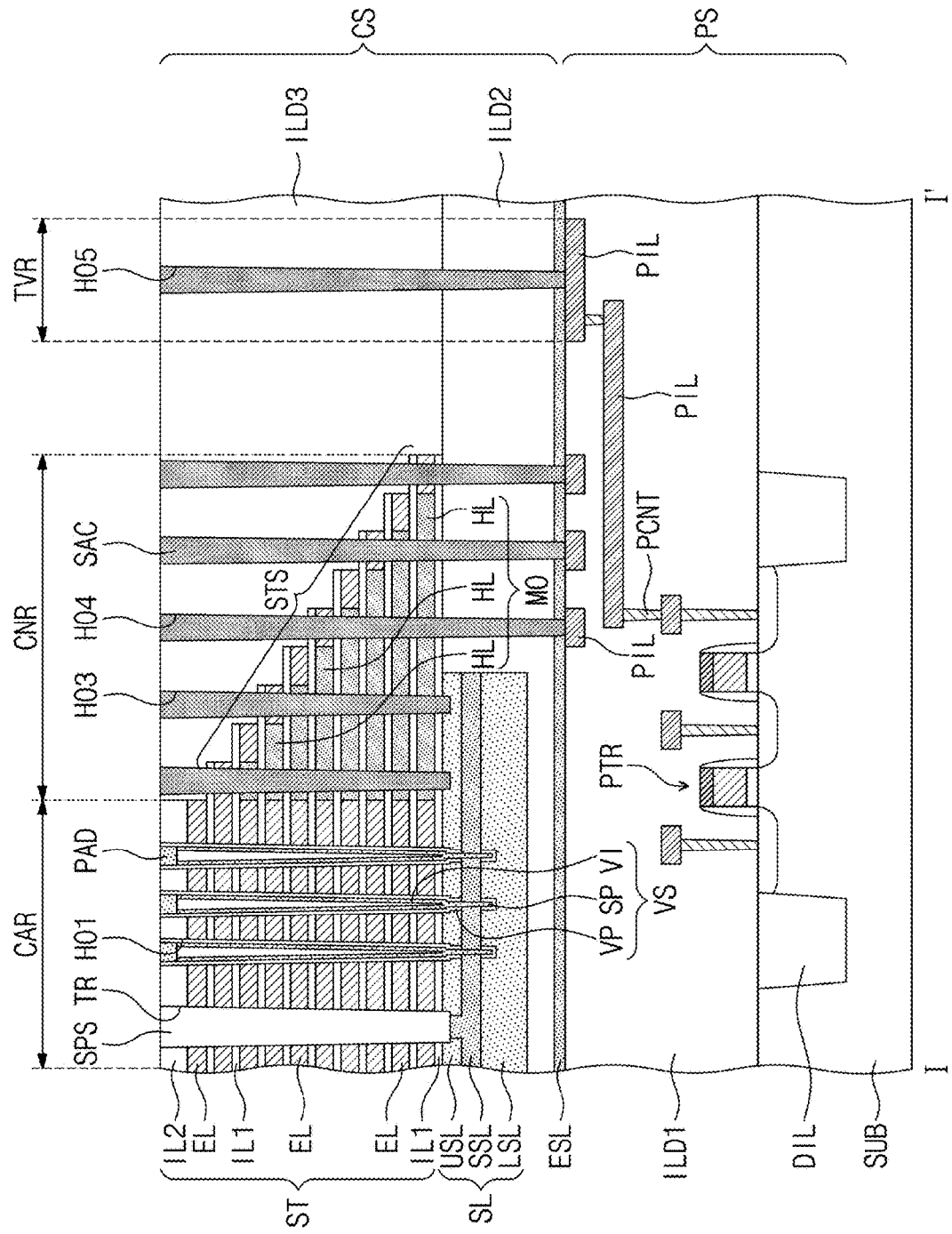

Referring to FIGS. 2 and 11, the sacrificial layers HL exposed through the trench TR may be replaced with the electrodes EL, respectively. In detail, the sacrificial layers HL exposed through the trench TR may be selectively removed, e.g. may be selectively removed with a wet etching process. The electrode EL may be respectively formed in empty spaces, from which the sacrificial layers HL are removed. The electrodes EL replaced may constitute, e.g. may correspond to, the electrode structure ST. Unremoved portions of the sacrificial layers HL, which are left on the connection region CNR, may constitute or correspond to the mold structure MO.

Figure 12:
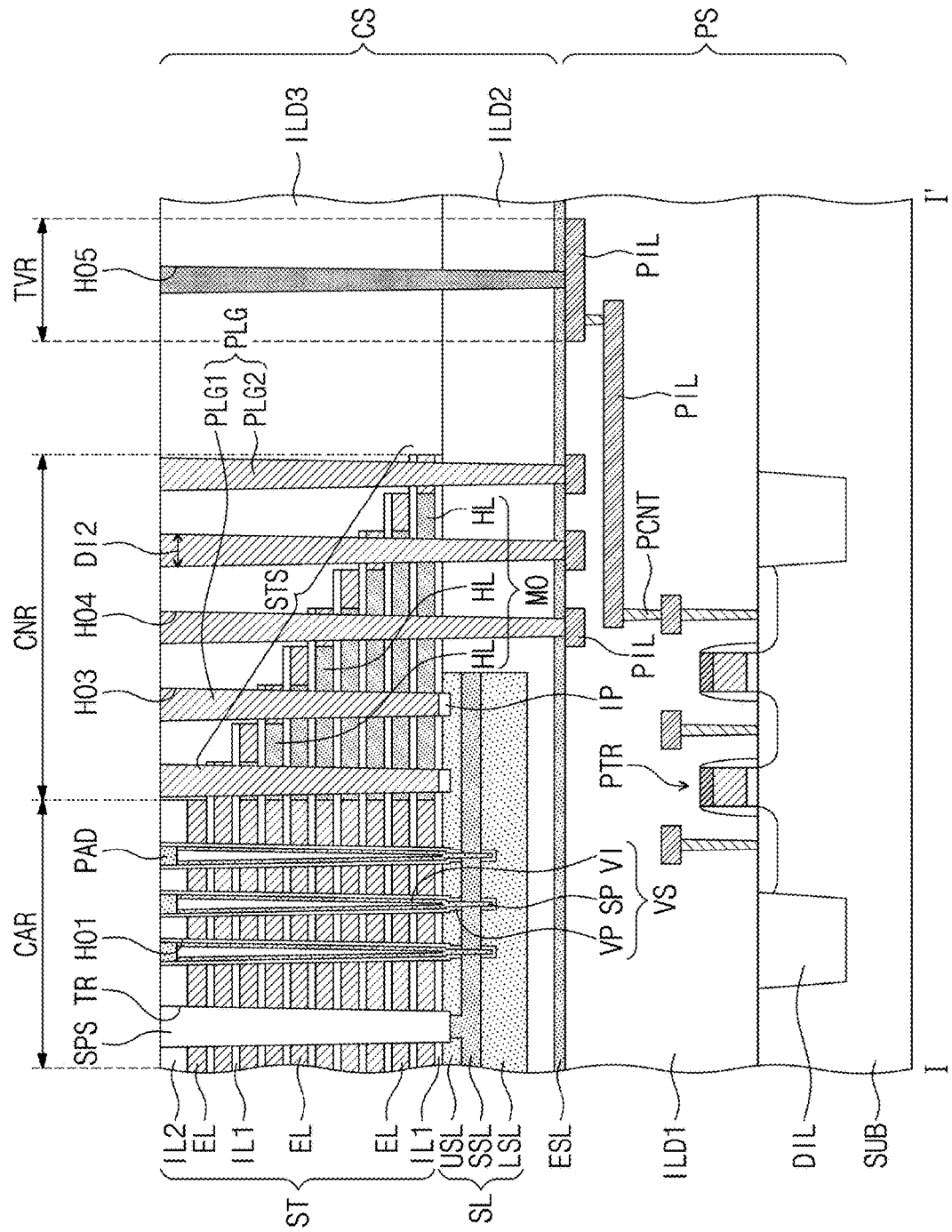

Referring to FIGS. 2 and 12, the third and fourth holes HO3 and HO4 may be evacuated by selectively removing the sacrificial material SAC from the third and fourth holes HO3 and HO4. An isotropic etching process may be performed on the third and fourth holes HO3 and HO4, from which the sacrificial material SAC is removed, to expand, e.g. to expand the diameters of, each of the third and fourth holes HO3 and HO4. Accordingly, each of the third and fourth holes HO3 and HO4 may have the second diameter DI2 at its top level. The second diameter DI2 may be larger than the first diameter DI1 previously described with reference to FIG. 5. The isotropic etching process may be or include a wet etching process; however, example embodiments are not limited thereto.

An oxidation process, such as a thermal oxidation process, may be performed on the upper semiconductor layer USL, which is exposed through the third holes HO3, to form the insulating pattern IP filling a lower portion of the third hole HO3. The first and second cell contact plugs PLG1 and PLG2 may be formed by filling the third and fourth holes HO3 and HO4, respectively, with a conductive material.

Figure 13:
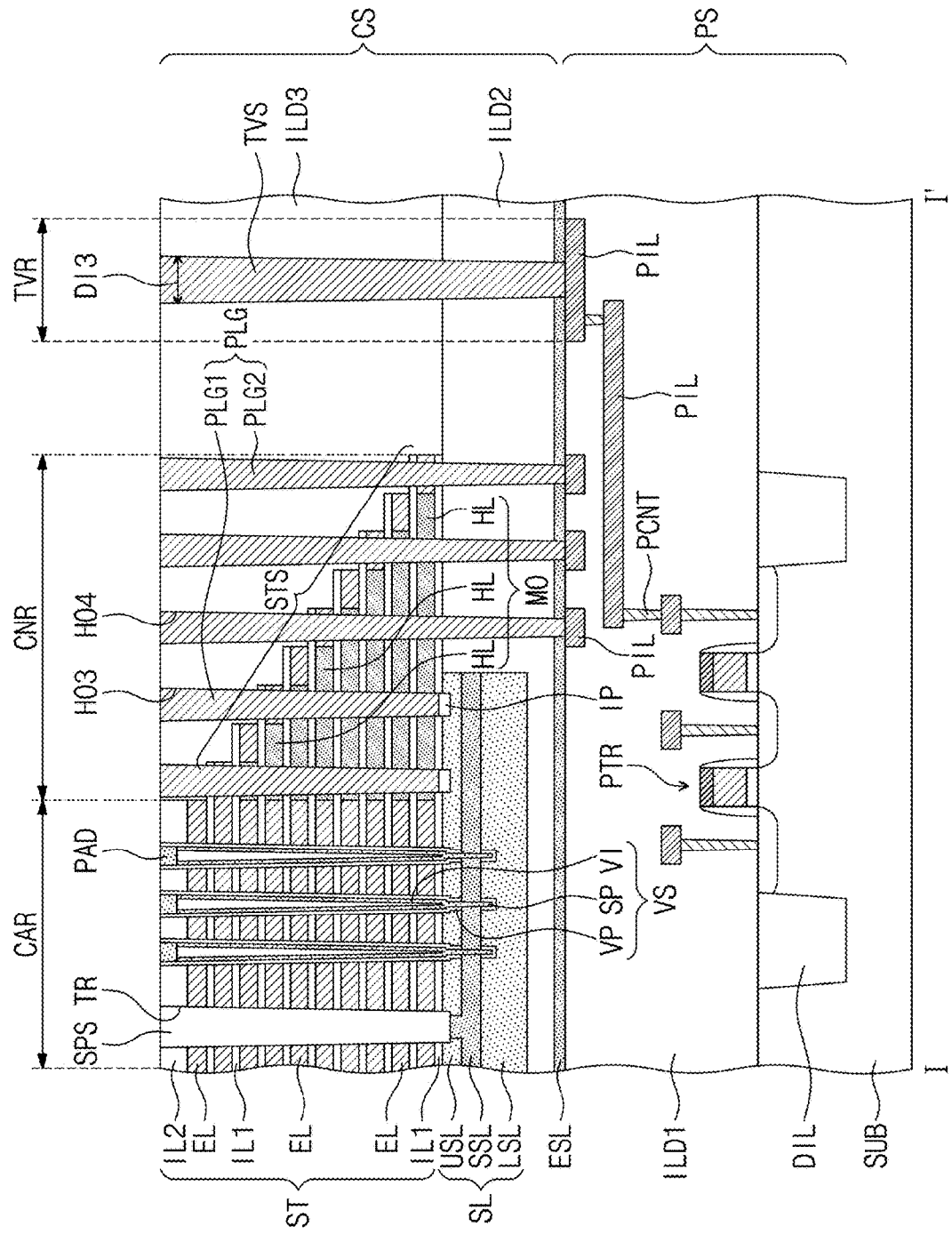
Figure 14A:
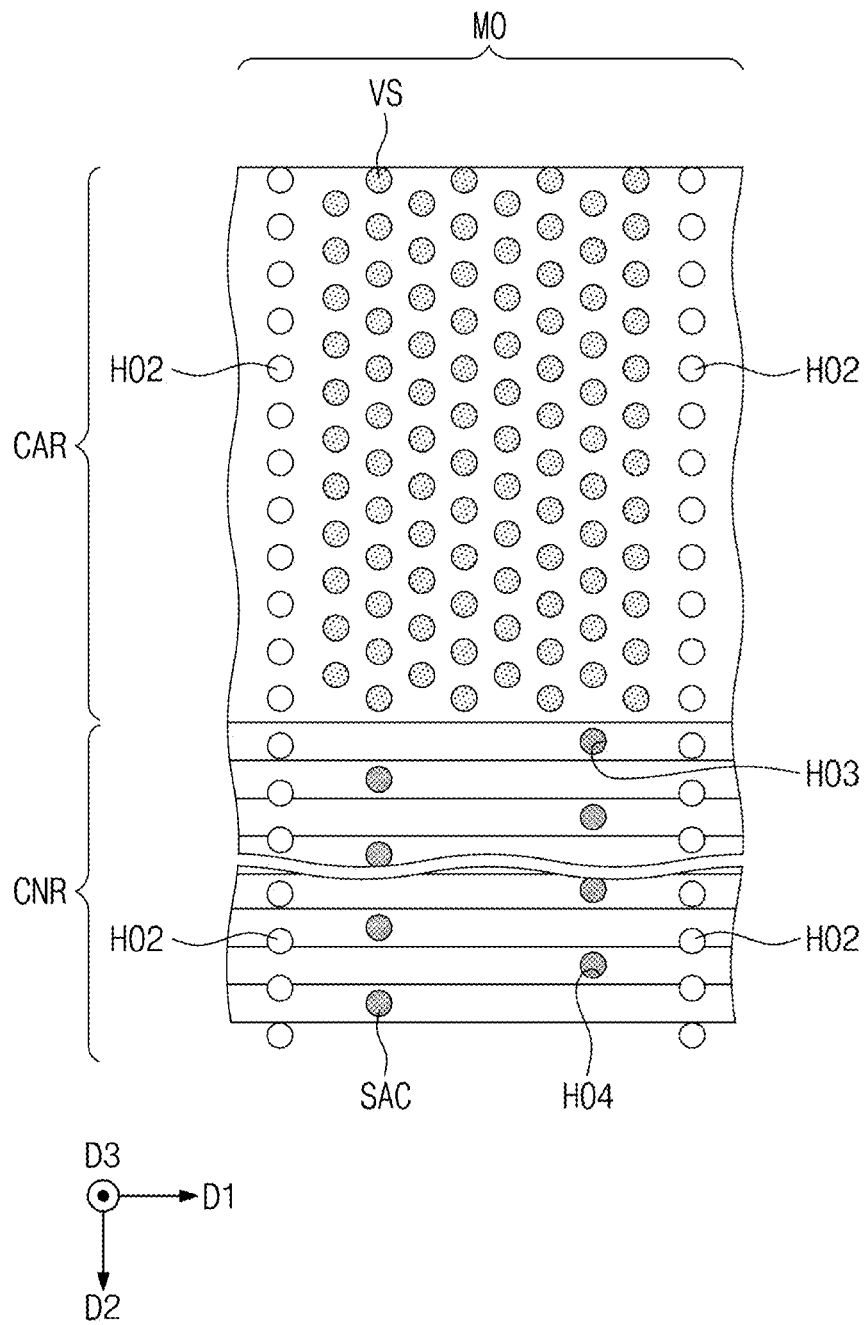
FIGS. 14A, 14B, and 14C are plan views illustrating a method of forming a trench of FIG. 8.
Figure 14B:
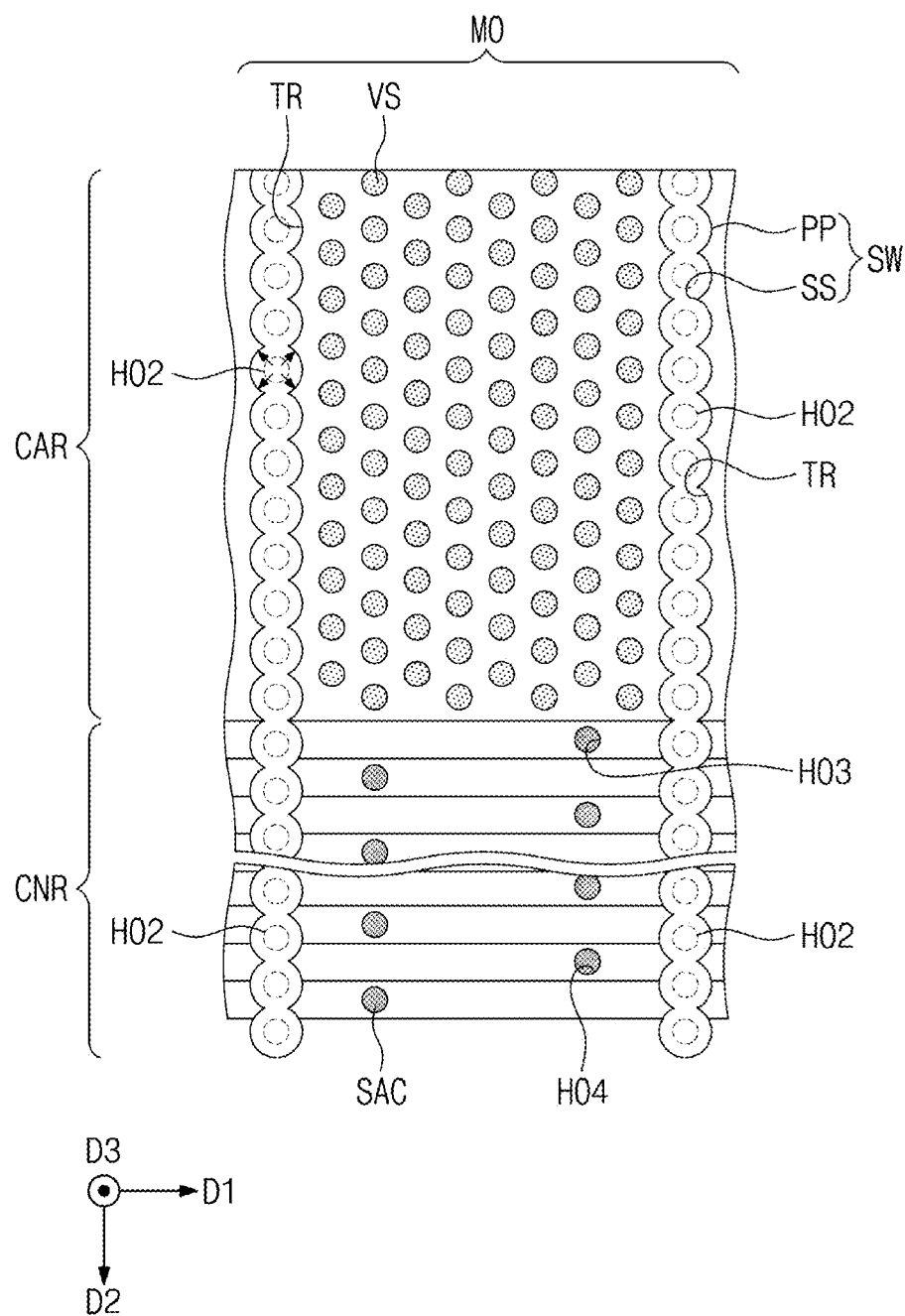
Figure 14C:
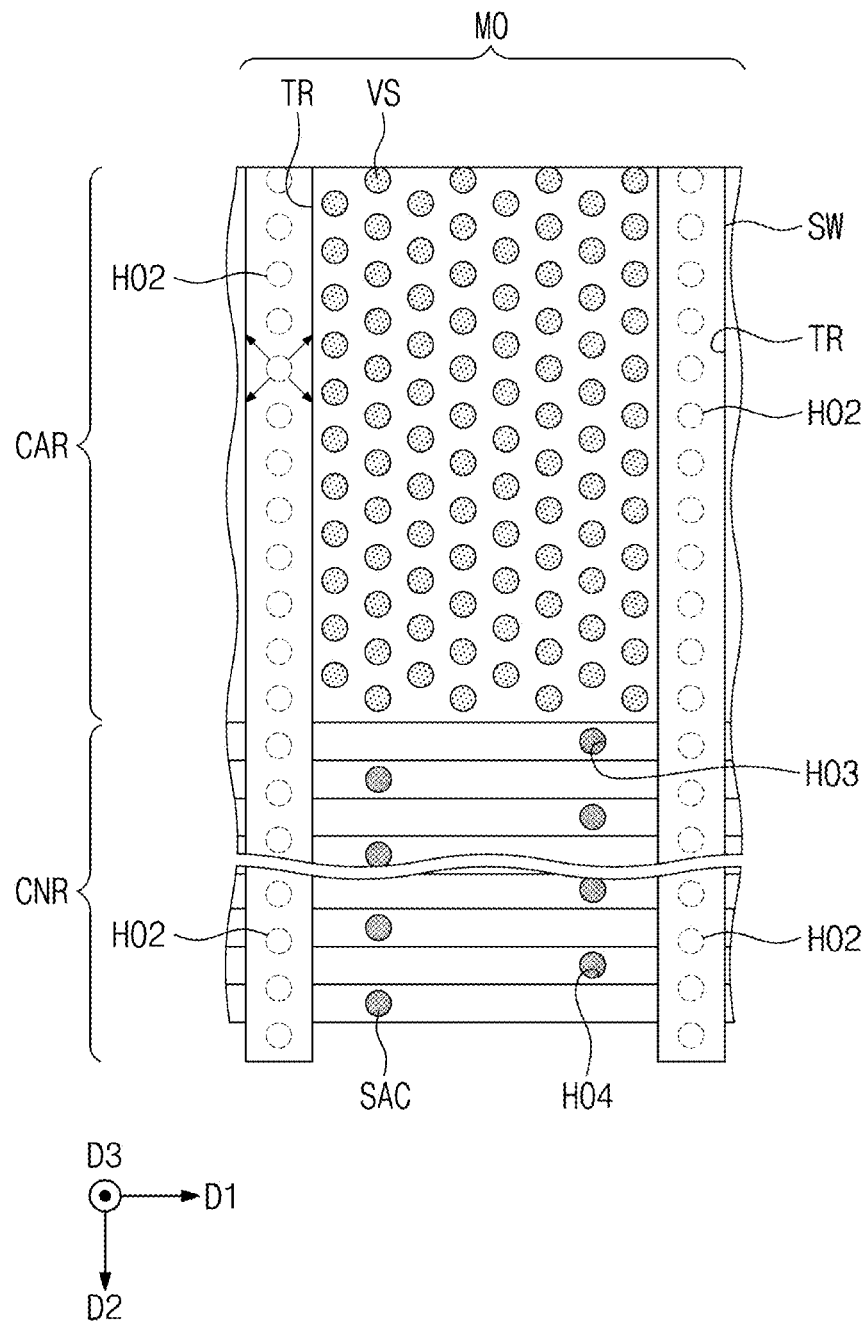

Referring to FIGS. 2 and 13, the fifth hole HO5 may be evacuated by selectively removing the sacrificial material SAC from the fifth hole HO5. An isotropic etching process such as a wet etching process may be performed on the fifth hole HO5, from which the sacrificial material SAC is removed, to expand the fifth hole HO5. Accordingly, the fifth hole HO5 may have the third diameter DI3 at its top level. The third diameter DI3 may be larger than the first diameter DI1 previously described with reference to FIG. 5. The through contact TVS may be formed by filling the fifth hole HO5 with a conductive material.

Referring back to FIGS. 2 and 3, the fourth interlayered insulating layer ILD4 may be formed on the mold structure MO and the third interlayered insulating layer ILD3. The bit line contact plugs BPLG and the vias VIA may be formed in the fourth interlayered insulating layer ILD4. The bit lines BL, which are electrically connected to the bit line contact plugs BPLG, and the connection lines CL, which are electrically connected to the vias VIA, may be formed on the fourth interlayered insulating layer ILD4.

According to some example embodiments of inventive concepts, simultaneously forming the first to fifth holes HO1-HO5 and defining the vertical channel structures VS, the separation structures SPS, the cell contact plugs PLG, and the through contact TVS may be possible. The first to fifth holes HO1-HO6 may have high aspect ratios. Since a plurality of structures are formed through a single process, a process of fabricating a semiconductor memory device may be simplified, and/or reduction in fabrication cost may be achieved. Since the first to fifth holes HO1-HO5 are simultaneously formed, the vertical channel structures VS, the separation structures SPS, the cell contact plugs PLG, and the through contact TVS may have top surfaces that are coplanar with each other.

Figure 15:
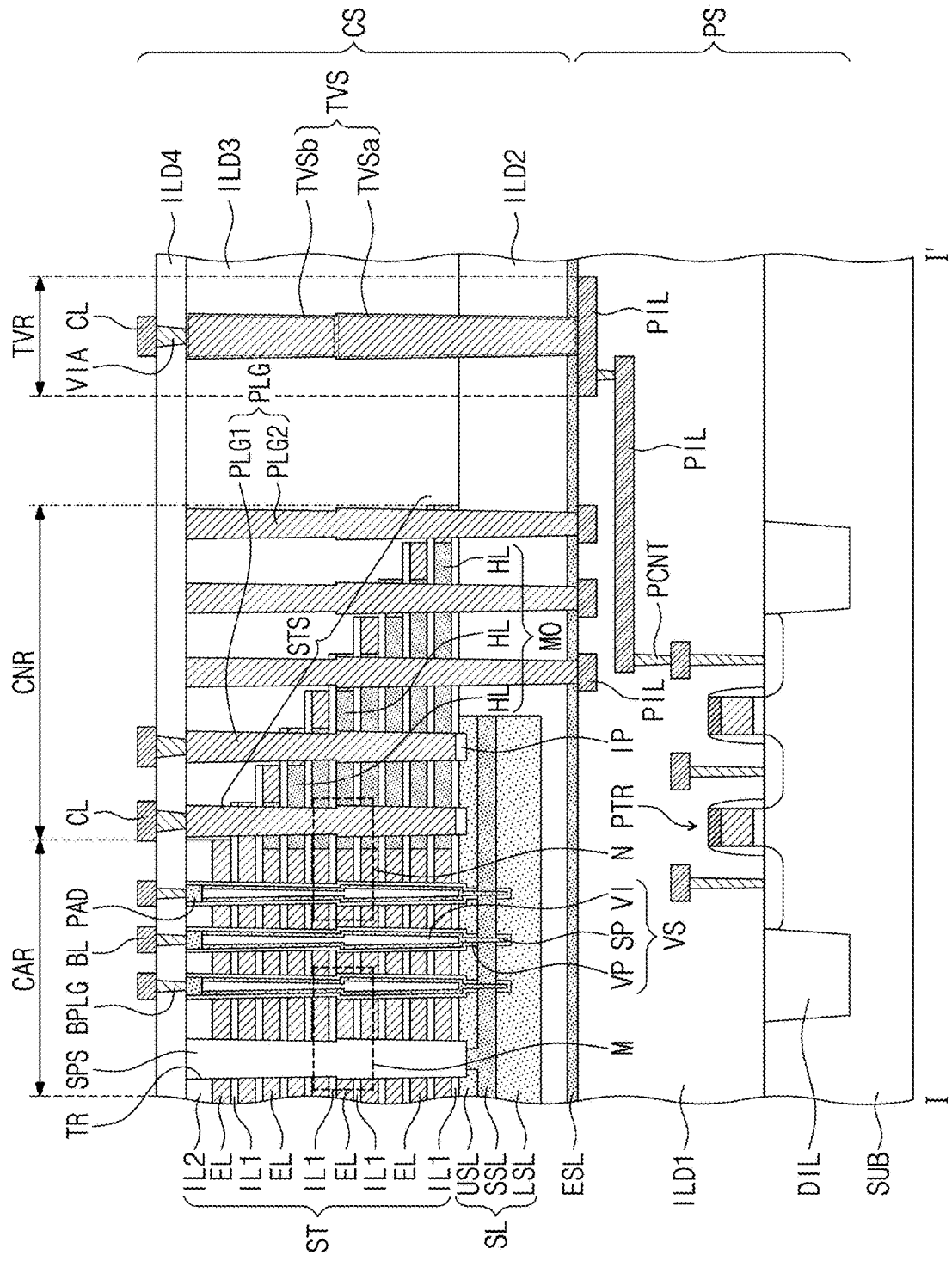
FIG. 15 is a sectional view taken along the line I-I' of FIG. 2 to illustrate a three-dimensional semiconductor memory device according to some example embodiments of inventive concepts.
Figure 16A:
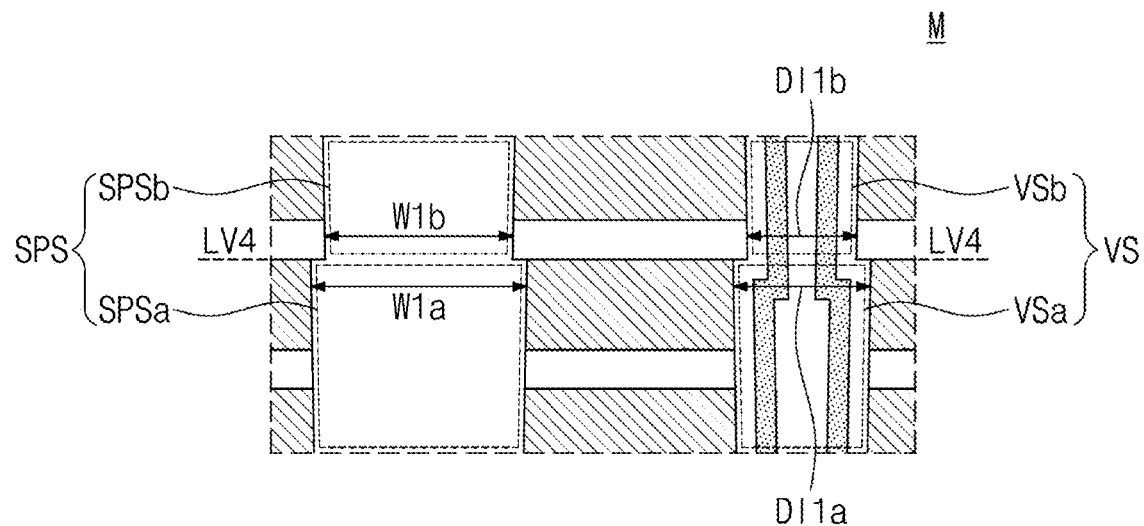
FIGS. 16A and 16B are enlarged sectional views illustrating portions 'M' and 'N', respectively, of FIG. 15.
Figure 16B:
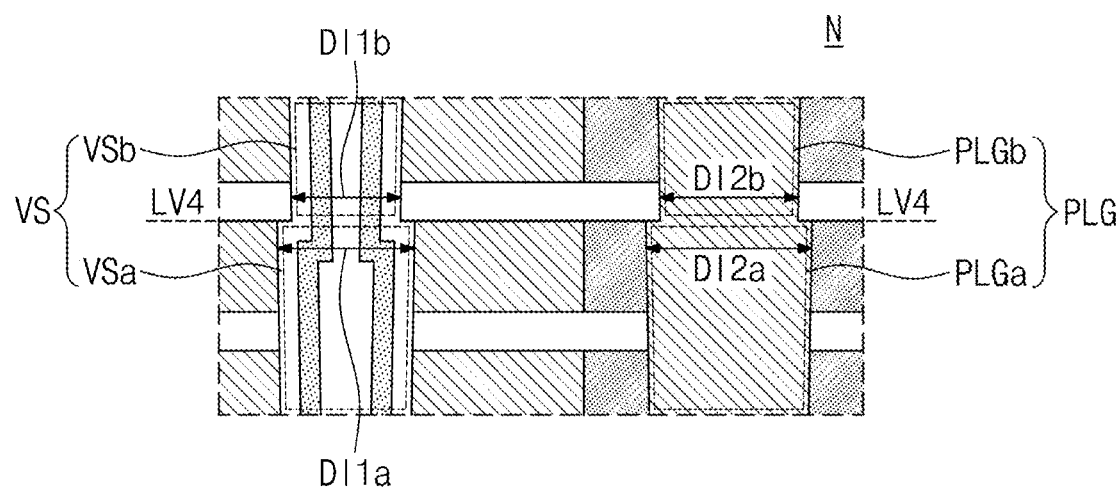

FIG. 15 is a sectional view taken along the line I-I' of FIG. 2 to illustrate a three-dimensional semiconductor memory device according to some example embodiments of inventive concepts. FIGS. 16A and 16B are enlarged sectional views illustrating portions 'M' and 'N', respectively, of FIG. 15. For concise description, an element previously described with reference to FIGS. 2 and 3 may be identified by the same reference number without repeating an overlapping description thereof.

Referring to FIGS. 2, 15, 16A, and 16B, each of the vertical channel structures VS may include a lower channel structure VSa and an upper channel structure VSb on the lower channel structure VSa. Each of the separation structures SPS may include a lower separation structure SPSa and an upper separation structure SPSb on the lower separation structure SPSa. Each of the cell contact plugs PLG may include a lower contact plug PLGa and an upper contact plug PLGb on the lower contact plug PLGa. The through contact TVS may include a lower through contact TVSa and an upper through contact TVSb on the lower through contact TVSa.

A top surface of the lower channel structure VSa, a top surface of the lower separation structure SPSa, a top surface of the lower contact plug PLGa, and a top surface of the lower through contact TVSa may be coplanar with each other. For example, the top surface of the lower channel structure VSa, the top surface of the lower separation structure SPSa, the top surface of the lower contact plug PLGa, and the top surface of the lower through contact TVSa may be located at the same level (e.g., a fourth level LV4).

A top surface of the upper channel structure VSb, a top surface of the upper separation structure SPSb, a top surface of the upper contact plug PLGb, and a top surface of the upper through contact TVSb may be coplanar with each other.

A diameter DI1a of an upper portion of the lower channel structure VSa may be larger than a diameter DI1b of a lower portion of the upper channel structure VSb. A diameter of the vertical channel structure VS may be abruptly changed near a border between the lower channel structure VSa and the upper channel structure VSb.

A width W1a of an upper portion of the lower separation structure SPSa may be larger than a width W1b of a lower portion of the upper separation structure SPSb. A width of the separation structure SPS may be abruptly changed near a border between the lower separation structure SPSa and the upper separation structure SPSb.

A diameter DI2a of an upper portion of the lower contact plug PLGa may be larger than a diameter DI2b of a lower portion of the upper contact plug PLGb. A diameter of the cell contact plug PLG may be abruptly changed near a border between the lower contact plug PLGa and the upper contact plug PLGb.

Figure 17:
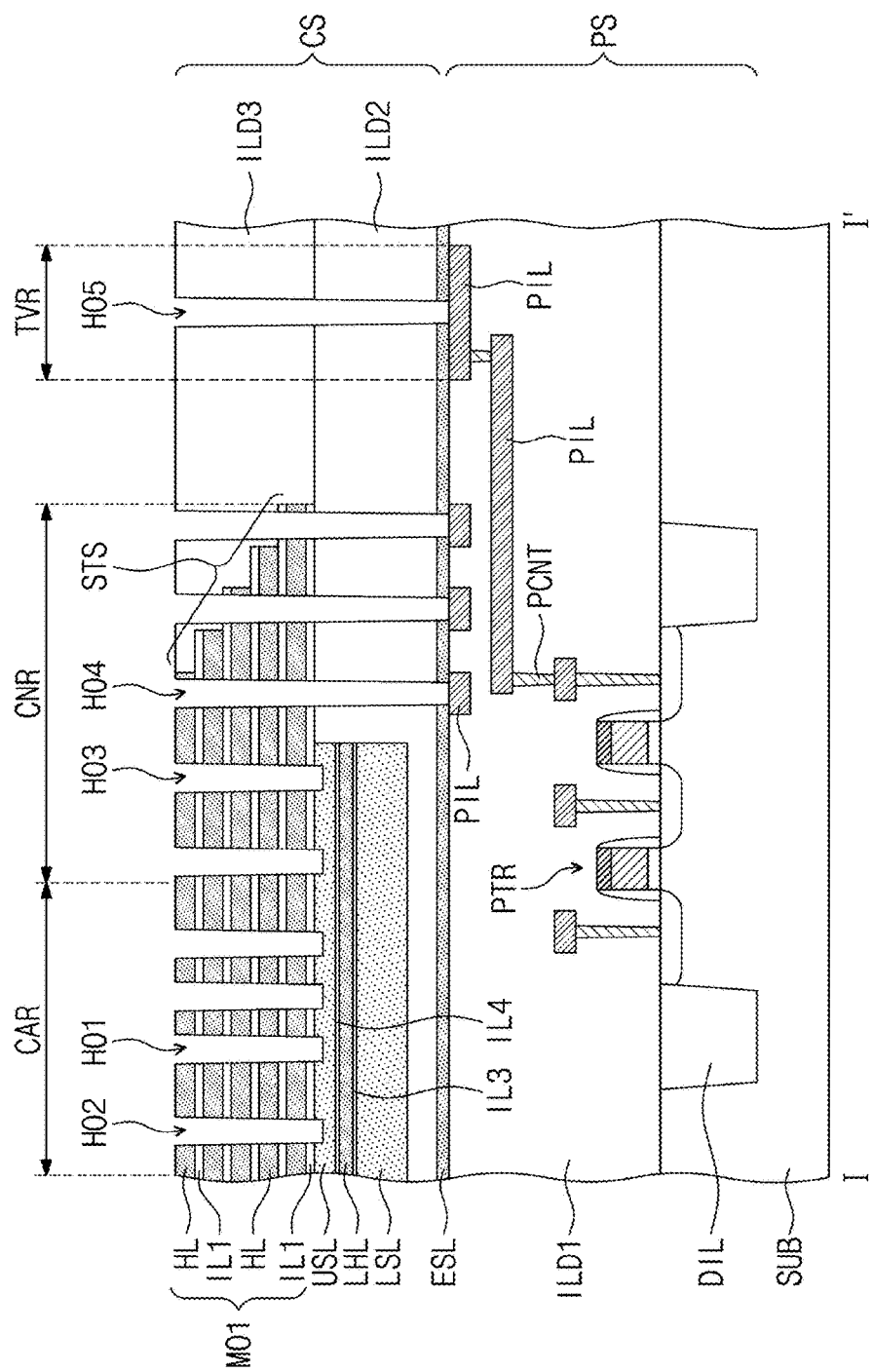
FIGS. 17 and 18 are sectional views, which are taken along the line I-I' of FIG. 2 to illustrate a method of fabricating a three-dimensional semiconductor memory device, according to some example embodiments of inventive concepts.
Figure 18:
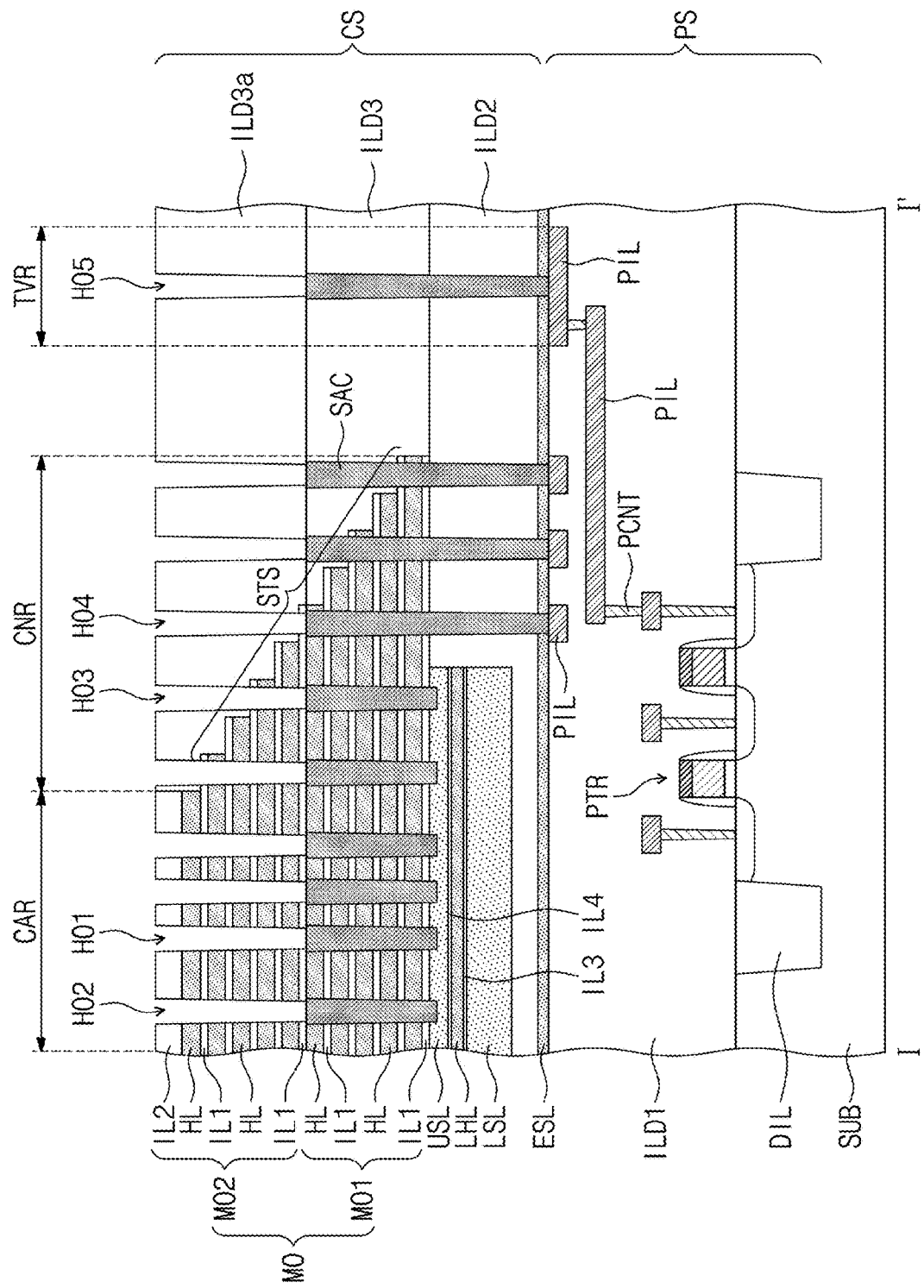

FIGS. 17 and 18 are sectional views, which are taken along the line I-I' of FIG. 2 to illustrate a method of fabricating a three-dimensional semiconductor memory device, according to some example embodiments of inventive concepts. For concise description, an element previously described with reference to FIG. 2 and FIGS. 4 to 14B may be identified by the same reference number without repeating an overlapping description thereof.

Referring to FIGS. 2 and 17, a first mold structure MO1 may be formed on the upper semiconductor layer USL. In detail, the first mold structure MO1 may be formed by vertically and alternately stacking the first insulating layers IL1 and the sacrificial layers HL on the upper semiconductor layer USL. The staircase structure STS may be formed in the first mold structure MO1. The third interlayered insulating layer ILD3 may be formed to cover the staircase structure STS of the first mold structure MO1.

A patterning process may be performed on the structure with the third interlayered insulating layer ILD3 to form the first to fifth holes HO1-HO5 with high aspect ratios. The first to fourth holes HO1-HO4 may be formed to penetrate the first mold structure MO1.

Referring to FIGS. 2 and 18, the sacrificial material SAC may be formed to fill the first to fifth holes HO1-HO5. A second mold structure MO2 may be formed on the first mold structure MO1 and the third interlayered insulating layer ILD3. In detail, the second mold structure MO2 may be formed by vertically and alternately stacking the first insulating layers IL1 and the sacrificial layers HL on the first mold structure MO1. The second insulating layer IL2 may be formed as the topmost layer of the second mold structure MO2. The staircase structure STS may be formed in the second mold structure MO2. An additional interlayered insulating layer ILD3a may be formed to cover the staircase structure STS of the second mold structure MO2.

A patterning process may be performed on the structure with the additional interlayered insulating layer ILD3a to additionally form first to fifth holes HO1-HO5 with high aspect ratios. The first to fifth holes HO1-HO5 may be formed to expose the sacrificial materials SAC filling the first to fifth holes HO1-HO5 of the first mold structure MO1. Subsequent processes may be performed in substantially the same manner as those described with reference to FIGS. 6 to 13.

In a method of fabricating a semiconductor memory device according to some example embodiments of inventive concepts, high-aspect-ratio holes defining vertical channel structures, separation structures, cell contact plugs, and through contact may be simultaneously formed. Since a plurality of structures are formed through a single process, a process of fabricating a semiconductor memory device may be simplified, and a reduction in fabrication cost may be achieved.

According to example embodiments described with reference to FIGS. 1-18, a semiconductor device may correspond to a three-dimensional memory device with cells over a peripheral circuit. However, example embodiments are not limited thereto, and a semiconductor device according to some example embodiments may include a semiconductor layer, an electrode structure on the semiconductor layer, the electrode structure including electrodes stacked on the semiconductor layer, a vertical channel structure penetrating the electrode structure and connected to the semiconductor layer, a separation structure penetrating the electrode structure, the separation structure extending in a first direction and horizontally dividing at least one of the electrodes of the electrode structure into a pair of electrodes, an interlayered insulating layer covering the electrode structure. When viewed in a plan view, a sidewall of the separation structure includes a protruding portion and a recessed portion, the protruding portion protrudes in a direction away from a center line of the separation structure, and the recessed portion is recessed toward the center line. A peripheral circuit structure may be on the substrate, but the cells may not be over the peripheral circuit.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor memory device comprising:
   a peripheral circuit structure on a substrate;
   a semiconductor layer on the peripheral circuit structure;
   an electrode structure on the semiconductor layer, the electrode structure including electrodes stacked on the semiconductor layer;
   a vertical channel structure penetrating the electrode structure and connected to the semiconductor layer;
   a separation structure penetrating the electrode structure, the separation structure extending in a first direction and horizontally dividing at least one of the electrodes of the electrode structure into a pair of electrodes;
   an interlayered insulating layer covering the electrode structure; and
   a through contact penetrating the interlayered insulating layer and electrically connected to the peripheral circuit structure,
   wherein a top surface of the separation structure, a top surface of the vertical channel structure, a top surface of the through contact, and a top surface of the interlayered insulating layer are coplanar with each other, and the semiconductor memory device further comprises a bit line plug on top of the top surface of the vertical channel structure above the coplanar top surfaces of the vertical channel structure, the through contact, the separation structure, and the interlayered insulating layer, when viewed in a plan view, a sidewall of the separation structure includes a protruding portion and a recessed portion, the protruding portion protrudes in a direction away from a center line of the separation structure, the recessed portion is recessed toward the center line, and the sidewall of the separation structure has at least one of a wavy or concave-convex shape.

2. The device of claim 1, wherein in a second direction, the protruding portion defines a largest width of the separation structure, in the second direction, the recessed portion defines a smallest width of the separation structure, and the second direction crosses the first direction.

3. The device of claim 2, wherein the largest width of the separation structure is larger than a diameter of an upper portion of the vertical channel structure.

4. The device of claim 1, wherein the vertical channel structure comprises:

a vertical semiconductor pattern having a pipe-like shape with an open top end; and a vertical insulating pattern including a data storing layer, the vertical insulating pattern interposed between the vertical semiconductor pattern and at least one of the electrodes.

5. The device of claim 1, wherein the electrodes of the electrode structure and the vertical channel structure penetrating the electrodes of the electrode structure correspond to three-dimensionally arranged memory cells.

6. The device of claim 1, wherein the semiconductor layer comprises a lower semiconductor layer, an upper semiconductor layer, and a source semiconductor layer interposed between the lower and upper semiconductor layers, and the vertical channel structure is connected to the source semiconductor layer.

7. The device of claim 1, further comprising:

a cell contact plug penetrating a staircase structure of the electrode structure, wherein the cell contact plug electrically connects to one of the electrodes of the electrode structure.

8. The device of claim 7, wherein the cell contact plug couples to a peripheral interconnection line of the peripheral circuit structure.

9. The device of claim 7, wherein the cell contact plug extends toward the semiconductor layer, and the device further comprises an insulating pattern interposed between the cell contact plug and the semiconductor layer.

10. A semiconductor memory device, comprising:

a peripheral circuit structure on a substrate;

a semiconductor layer on the peripheral circuit structure;

an electrode structure on the semiconductor layer, the electrode structure including electrodes stacked on the semiconductor layer;

a vertical channel structure penetrating the electrode structure and connected to the semiconductor layer;

a separation structure penetrating the electrode structure and horizontally dividing at least one of the electrodes of the electrode structure into a pair of electrodes;

a cell contact plug penetrating a staircase structure of the electrode structure;

an interlayered insulating layer covering the electrode structure; and a through contact penetrating the interlayered insulating layer and being electrically connected to the peripheral circuit structure, wherein the separation structure includes a lower separation structure and an upper separation structure on the lower separation structure, a width of an upper portion of the lower separation structure is larger than a width of a lower portion of the upper separation structure, wherein the separation structure extends in a first direction, when viewed in a plan view, the separation structure has a portion having a circular sidewall, the circular sidewall of the separation structure includes a plurality of protruding portions, and each of the protruding portions protrudes in a second direction crossing the first direction.

11. The device of claim 10, wherein the vertical channel structure includes a lower channel structure and an upper channel structure on the lower channel structure, a width of an upper portion of the lower channel structure is larger than a width of a lower portion of the upper channel structure, and a top surface of the lower separation structure and a top surface of the lower channel structure are at a same level.

12. The device of claim 11, wherein the cell contact plug includes a lower contact plug and an upper contact plug on the lower contact plug, a width of an upper portion of the lower contact plug is larger than a width of a lower portion of the upper contact plug, and a top surface of the lower contact plug is at a same level as the top surface of the lower channel structure.

13. The device of claim 10, wherein the through contact includes a lower through contact and an upper through contact on the lower through contact, and a width of an upper portion of the lower through contact is larger than a width of a lower portion of the lower through contact.

14. A semiconductor memory device, comprising:

a peripheral circuit structure on a substrate, the peripheral circuit structure including a peripheral transistor on the substrate, a peripheral interconnection line on the peripheral transistor, and a peripheral contact electrically connecting the peripheral transistor to the peripheral interconnection line;

a semiconductor layer on the peripheral circuit structure;

an electrode structure on the semiconductor layer, the electrode structure including electrodes stacked on the semiconductor layer;

a vertical channel structure penetrating the electrode structure and connected to the semiconductor layer;

a separation structure penetrating the electrode structure extending in a first direction and horizontally dividing a first electrode of the electrodes into a pair of electrodes;

a cell contact plug penetrating a staircase structure of the electrode structure and electrically connected to a second electrode of the electrodes;

an interlayered insulating layer covering the electrode structure;

a through contact penetrating the interlayered insulating layer and electrically connected to the peripheral interconnection line of the peripheral circuit structure; and a bit line and a connection line on the interlayered insulating layer, wherein the vertical channel structure includes, a vertical semiconductor pattern having a shape like a pipe with an open top end, and a vertical insulating pattern including a data storing layer, the data storing layer interposed between the vertical semiconductor pattern and a third electrode of the electrodes, wherein the bit line is electrically connected to the vertical semiconductor pattern, the connection line is electrically connected to the through contact, a top surface of the separation structure, a top surface of the vertical channel structure, a top surface of the cell contact plug, and a top surface of the through contact are coplanar with each other, and when viewed in a plan view, the separation structure has a portion having a circular sidewall.

15. The device of claim 14, wherein the semiconductor layer comprises a lower semiconductor layer, an upper semiconductor layer, and a source semiconductor layer interposed between the lower and upper semiconductor layers, and the vertical semiconductor pattern connects to the source semiconductor layer.

16. The device of claim 14, wherein the staircase structure of the electrode structure comprises a mold structure below the second electrode, the mold structure includes an insulator, and the cell contact plug penetrates the second electrode and the mold structure.

17. The device of claim 14, wherein a largest diameter of the cell contact plug is larger than a largest diameter of the vertical channel structure.

18. The device of claim 14, wherein a largest diameter of the through contact is larger than a largest diameter of the vertical channel structure.

* * * * *